United States Patent
Choi et al.

(10) Patent No.: US 11,588,000 B2
(45) Date of Patent: Feb. 21, 2023

(54) DISPLAY DEVICE

(71) Applicant: SAMSUNG DISPLAY CO., LTD., Yongin-si (KR)

(72) Inventors: Jonghyun Choi, Seoul (KR); Seunghwan Cho, Yongin-si (KR); Donghwan Shim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/139,739

(22) Filed: Sep. 24, 2018

(65) Prior Publication Data
US 2019/0115415 A1  Apr. 18, 2019

(30) Foreign Application Priority Data

Oct. 12, 2017  (KR) .......................... 10-2017-0132099

(51) Int. Cl.
*H01L 27/32* (2006.01)
*G06F 3/041* (2006.01)
(Continued)

(52) U.S. Cl.
CPC .......... *H01L 27/3276* (2013.01); *G06F 3/047* (2013.01); *G06F 3/0412* (2013.01);
(Continued)

(58) Field of Classification Search
CPC ......... G06F 3/0412; G06F 2203/04111; G06F 2203/04103; G06F 3/04164; G06F 3/047;
(Continued)

(56) References Cited

U.S. PATENT DOCUMENTS

2012/0044181 A1    2/2012  Kim et al.
2013/0033439 A1*   2/2013  Kim ............... G02F 1/13338
                                                       345/173
(Continued)

FOREIGN PATENT DOCUMENTS

JP       2005536768     12/2005
KR     1020130015582     2/2013
(Continued)

OTHER PUBLICATIONS

Korean Office Action dated Dec. 21, 2021 for Korean Application Serial No. 10-2017-0132099.

*Primary Examiner* — Nelson M Rosario
*Assistant Examiner* — Scott D Au
(74) *Attorney, Agent, or Firm* — F. Chau & Associates, LLC

(57) ABSTRACT

A display device that can improve transmittance of a sensor area that overlaps a display area includes a substrate that includes a display area in which a plurality of pixels are disposed, a sensor area in the display area, the sensor area overlapping a sensor, and a wiring connection area between the display area and the sensor area; a first wiring and a second wiring disposed in the display area and that extend in a first direction and are connected to the plurality of pixels; and a third wiring disposed in the sensor area and that extends in the first direction, wherein the third wiring is connected to the second wiring and overlaps the first wiring (Continued)

in a plan view. The third wiring is spaced apart from the first wiring with a first insulating layer interposed therebetween.

28 Claims, 24 Drawing Sheets

(51) Int. Cl.
  *H01L 51/52* (2006.01)
  *H01L 51/50* (2006.01)
  *G09G 3/3291* (2016.01)
  *G09G 3/3266* (2016.01)
  *G06F 3/047* (2006.01)
  *G09G 3/3233* (2016.01)

(52) U.S. Cl.
  CPC ......... *G09G 3/3233* (2013.01); *G09G 3/3266* (2013.01); *G09G 3/3291* (2013.01); *H01L 27/323* (2013.01); *H01L 51/5012* (2013.01); *H01L 51/5203* (2013.01); *G09G 2300/0426* (2013.01); *G09G 2300/0819* (2013.01); *G09G 2300/0842* (2013.01); *G09G 2300/0861* (2013.01); *H01L 27/3211* (2013.01); *H01L 27/3223* (2013.01)

(58) Field of Classification Search
  CPC ......... G06F 2203/04112; G06F 1/1637; G06F 3/0445; H01L 27/3276; H01L 27/3223; H01L 51/5203; G09G 3/3266
  See application file for complete search history.

(56) References Cited

U.S. PATENT DOCUMENTS

| | | | |
|---|---|---|---|
| 2016/0092020 A1* | 3/2016 | Azumi | G06F 3/0412 345/173 |
| 2016/0380038 A1 | 12/2016 | Kang et al. | |
| 2017/0033173 A1 | 2/2017 | Kim | |
| 2017/0103247 A1* | 4/2017 | Mizuhashi | G06F 3/044 |
| 2017/0186957 A1* | 6/2017 | Lee | H01L 27/3276 |
| 2018/0059473 A1* | 3/2018 | Uchida | G02F 1/136209 |

FOREIGN PATENT DOCUMENTS

| | | | | |
|---|---|---|---|---|
| KR | 20130015582 A * | 2/2014 | ......... | G06F 3/04164 |
| KR | 10-2015-0078900 | 7/2015 | | |
| KR | 10-2017-0002730 | 1/2017 | | |
| KR | 10-2017-0015746 | 2/2017 | | |

* cited by examiner

DISPLAY DEVICE

CROSS-REFERENCE TO RELATED APPLICATION

This application claims priority under 35 U.S.C. § 119 from, and the benefit of, Korean Patent Application No. 10-2017-0132099, filed on Oct. 12, 2017 in the Korean Intellectual Property Office (KIPO), the contents of which are herein incorporated by reference in their entirety.

TECHNICAL FIELD

Exemplary embodiments of the present invention are directed to a display device that can improve transmittance of a sensor area in a display area.

DISCUSSION OF RELATED ART

Flat panel display (FPD) devices have reduced weight and volume, as compared to a cathode ray tube (CRT). Such FPD devices include liquid crystal display (LCD) devices, field emission display (FED) devices, plasma display panel (PDP), devices or organic light emitting diode (OLED) display devices, for example.

Among the FPD devices, OLED display devices display images use OLEDs to generate light by recombination of electrons and holes.

In addition, as a display area occupies most of a front surface in a mobile terminal, other components, such as a camera, a proximity sensor, a fingerprint sensor, an illuminance sensor, a near-infrared sensor, etc., may overlap the display area.

SUMMARY

Exemplary embodiments of the present invention are directed to a display device that can improve transmittance of a sensor area that overlaps a display area.

According to an exemplary embodiment, a display device includes: a substrate that includes a display area in which a plurality of pixels are disposed, a sensor area in the display area, the sensor area overlapping a sensor, and a wiring connection area between the display area and the sensor area; a first wiring and a second wiring disposed in the display area that extend in a first direction and are connected to the plurality of pixels; and a third wiring disposed in the sensor area and that extends in the first direction, wherein the third wiring is connected to the second wiring and overlaps the first wiring in a plan view. The third wiring is spaced apart from the first wiring with a first insulating layer interposed therebetween.

A contact hole may penetrate the first insulating layer in the wiring connection area through which second wiring is connected to the third wiring.

The third wiring may further include a first bent portion in the wiring connection area that extends in a second direction that crosses the first direction wherein the first bent portion connects to the second wiring through the contact hole.

The first wiring may extend in the first direction into the sensor area.

The display device may further include a plurality of dummy pixels in the wiring connection area adjacent to the display area.

The first wiring and the second wiring may be disposed on a substantially same layer.

The second wiring and the third wiring may be disposed on a substantially same layer.

The third wiring may further include a second bent portion in the wiring connection area that extends in the second direction.

The third wiring may overlap the first wiring in the wiring connection area and the sensor area in a plan view.

The display device may further include a fifth wiring connected to the pixel and that extends in a second direction that crosses the first, second and third wirings. The fifth wiring may be spaced apart from the first, second and third wirings by a second insulating layer.

The fifth wiring may be disposed above the third wiring.

The fifth wiring may be disposed below the third wiring.

The pixel may include a pixel electrode on the substrate, a light emitting layer on the pixel electrode and a common electrode on the light emitting layer. One of the first wiring, the third wiring or the fifth wiring may be disposed in in the sensor area in substantially the same layer as the pixel electrode. At least one of the pixel electrode, the light emitting layer or the common electrode is not disposed in the sensor area One of the first wiring, the third wiring or the fifth wiring may be a transparent electrode or a nanowire in a form of a mesh in the sensor area.

The display device may further include at least one floating wiring that overlaps the fifth wiring in a plan view and that is connected to the fifth wiring through a contact hole.

According to an exemplary embodiment, a display device includes: a substrate that includes a display area in which a plurality of pixels are disposed and a sensor area in the display area, the sensor area overlapping a sensor; and a gate wiring, a data wiring and a power wiring connected to the pixel. The power wiring has a mesh shape in which a plurality of wirings cross each other in a plane and are not disposed in the sensor area.

The power wiring may include a first power wiring that extends in a first direction and a second power wiring that extends in a second direction that crosses the first direction.

The first power wiring and the second power wiring may be disposed on a substantially same layer.

The first power wiring and the second power wiring may be spaced apart from each other by a first insulating layer and be connected to each other through a contact hole formed in the first insulating layer.

The first power wiring and the gate wiring may be disposed in substantially a same layer and the second power wiring and the data wiring may be disposed in substantially a same layer.

At least one of the gate wiring or the data wiring may cross the sensor area.

The gate wiring may include a first gate wiring and a second gate wiring. The first gate wiring and the second gate wiring may be spaced apart from each other in the display area and overlap each other in a plan view in the sensor area with a second insulating layer therebetween.

Each of the plurality of pixels may include a pixel electrode connected to the data wiring, a light emitting layer on the pixel electrode and a common electrode on the light emitting layer. One of the data wiring, the first gate wiring or the second gate wiring may be disposed in the sensor area in substantially a same layer as the pixel electrode.

One of the data wiring, the first gate wiring or the second gate wiring may be a transparent electrode or a nanowire in a form of a mesh in the sensor area.

At least one of the gate wiring or the data wiring is not disposed in the sensor area.

At least one of the gate wiring or the data wiring may include: a first wiring and a second wiring disposed in the display area and that extend in a first direction across the sensor area and are separated from each other by the sensor area; and a third wiring disposed outside the sensor area and that connects the first wiring and the second wiring.

The third wiring may be spaced apart from the first wiring and the second wiring with a third insulating layer interposed therebetween and the third wiring is connected to the first wiring and the second wiring through a contact hole formed in the third insulating layer.

The display device may further include a sealing member on the substrate, the sealing member including one or more inorganic layers and one or more organic layers which are alternately disposed. The organic layer may be disposed outside the sensor area.

The display device may further include a touch electrode on the substrate. The touch electrode may be disposed outside the sensor area.

According to an exemplary embodiment, a display device includes: a substrate that includes a display area in which a plurality of pixels are disposed and a sensor area in the display area, the sensor area overlapping a sensor; a wiring connected to the pixel, the wiring that crosses the sensor area; and at least one of an insulating layer above the wiring or an insulating layer below the wiring. The insulating layer is not disposed in an area that does not overlap the wiring in the sensor area.

DETAILED DESCRIPTION

Figure 1:
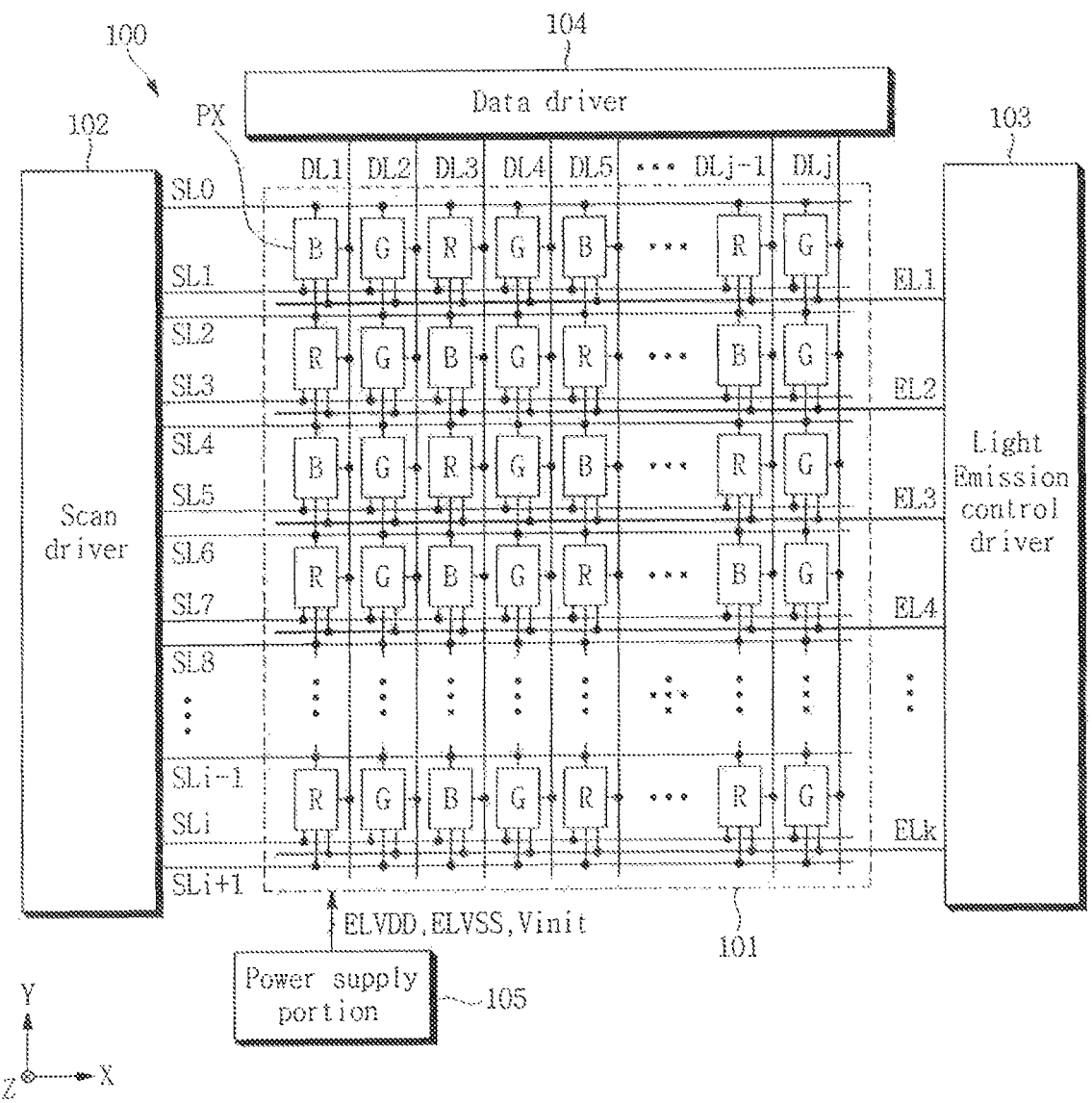
FIG. 1 is a block diagram of a display device according to an exemplary embodiment.

Exemplary embodiments will now be described more fully hereinafter with reference to the accompanying drawings. Although embodiments may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Further when a layer, area, or plate is referred to as being "below" another layer, area, or plate, it may be directly below the other layer, area, or plate, or intervening layers, areas, or plates may be present therebetween.

Throughout the specification, when an element is referred to as being "connected" to another element, the element may be "directly connected" to the other element, or "electrically connected" to the other element with one or more intervening elements interposed therebetween.

It will be understood that the words "about" or "approximately" as used herein is inclusive of the stated value and means within an acceptable range of deviation for the particular value as determined by one of ordinary skill in the art, considering the measurement in question and the error associated with measurement of the particular quantity, i.e., the limitations of the measurement system.

Hereinafter, a display device according to an exemplary embodiment will be described in detail with reference to FIGS. 1 to 21D.

FIG. 1 is a block diagram of a display device according to an exemplary embodiment.

A display device 100 according to an exemplary embodiment includes a display panel 101, a scan driver 102, a light emission control driver 103, a data driver 104 and a power supply portion 105, as illustrated in FIG. 1.

According to an embodiment, the display panel 101 includes "i+2" number of scan lines SL0 to SLi+1, "k" number of light emission control lines EL1 to ELk, "j" number of data lines DL1 to DLj and "k×j" number of pixels PX, where each of i, j and k is a natural number greater than L.

According to an embodiment, the scan lines SL0 to SLi+1 are spaced apart from each other in a Y-axis direction and each of the scan lines SL0 to SLi+1 extends in an X-axis direction. The light emission control lines EL1 to ELk are spaced apart from each other in the Y-axis direction and each of the light emission control lines EL1 to ELk extends in the X-axis direction. The data lines DL1 to DLj are spaced apart from each other in the X-axis direction and each of the data lines DL to DLj extends in the Y-axis direction.

According to an embodiment, the scan driver 102 generates scan signals based on a scan control signal received from a timing controller and sequentially transmits the scan signals to the plurality of scan lines SL0 to SLi+1. During one frame period, the scan driver 102 transmits the first to i-th scan signals sequentially starting from the first scan signal.

According to an embodiment, the light emission control driver 103 generates light emission control signals based on a control signal received from a timing controller and sequentially transmits the light emission control signals to the plurality of light emission control lines EL1 to ELk. In an exemplary embodiment, the light emission control driver 103 is embedded in the scan driver 102. For example, the scan driver 102 further performs the function of the light emission control driver 103. In such an exemplary embodiment, the scan lines SL0 to SLi+1 and the light emission control lines EL1 to ELk are driven together by the scan driver 102. Unless otherwise specifically defined, the scan lines and the scan driver may be understood to include the light emission control lines and the light emission control driver, respectively.

According to an embodiment, the data driver 104 transmits first to i-th data voltages to the first to j-th data lines DL1 to DLj, respectively. For example, the data driver 104 receives image data signals and data control signals from a timing controller. In addition, the data driver 104 samples the image data signals based on the data control signal, latches the sampled image data signals sequentially to correspond to one horizontal line in each horizontal period and transmits the latched image data signals to the data lines DL1 to DLj substantially simultaneously.

According to an embodiment, the pixels PX are arranged at the display panel 101 in a matrix form. The pixels PX are disposed in a display area 310, shown in FIG. 6, of the display panel 101. The pixels PX emit light of different colors. For example, of pixels PX illustrated in FIG. 1, a pixel indicated by a symbol "R" emits red light, a pixel indicated by a symbol "G" emits green light and a pixel indicated by a symbol "B" emits blue light. In an exemplary embodiment, the display panel 101 may further include at least one white pixel which emits white light.

According to an embodiment, each pixel PX receives a high potential driving voltage ELVDD, a low potential driving voltage ELVSS and an initialization voltage Vinit from the power supply portion 105.

Figure 2:
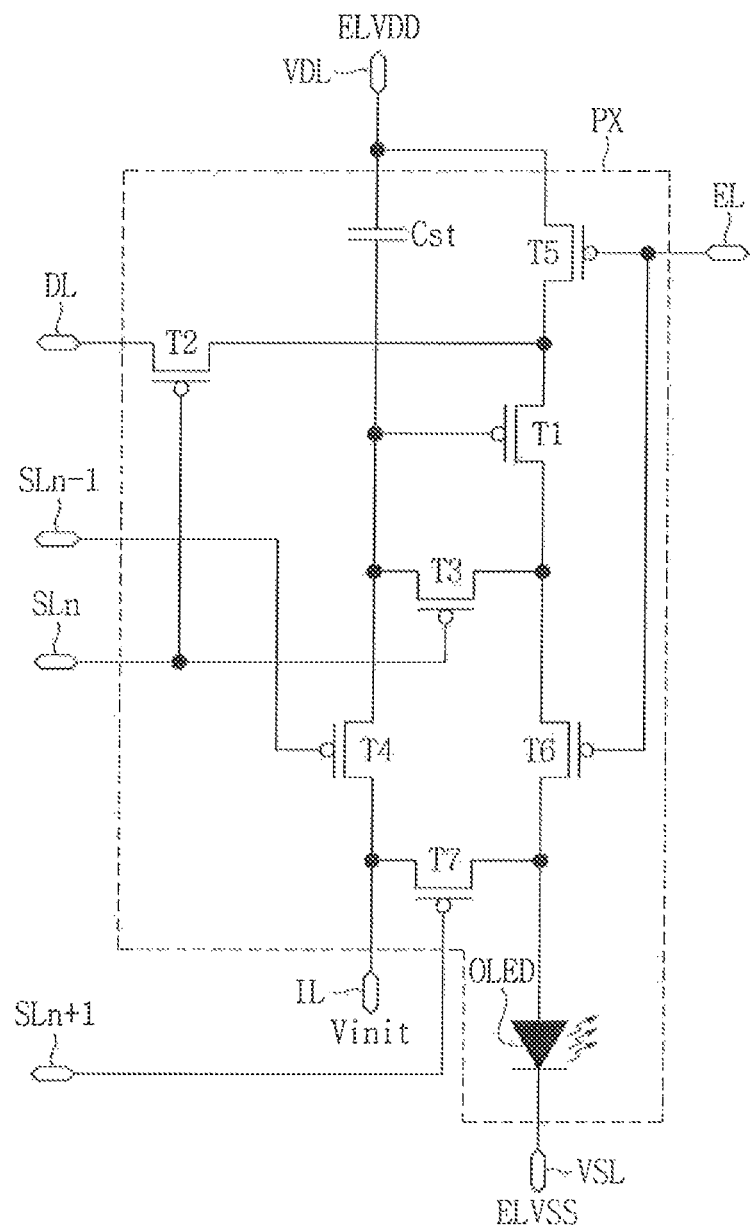
FIG. 2 is an equivalent circuit diagram of one pixel illustrated in FIG. 1.

FIG. 2 is an equivalent circuit diagram of one pixel illustrated in FIG. 1, according to an exemplary embodiment.

As illustrated in FIG. 2, according to an embodiment, one pixel PX includes a first thin film transistor T1, a second thin film transistor T2, a third thin film transistor T3, a fourth thin film transistor T4, a fifth thin film transistor T5, a sixth thin film transistor T6, a seventh thin film transistor T7, a storage capacitor Cst and an organic light emitting diode ("OLED").

According to an embodiment, each of the first, second, third, fourth, fifth, sixth and seventh thin film transistors T1, T2, T3, T4, T5, T6 and T7 is a P-type thin film transistor, as illustrated in FIG. 2. However, exemplary embodiments are not limited thereto and in an exemplary embodiment, each of the first, second, third, fourth, fifth, sixth and seventh thin film transistors T1, T2, T3, T4, T5, T6 and T7 may be an N-type thin film transistor.

Figure 3:
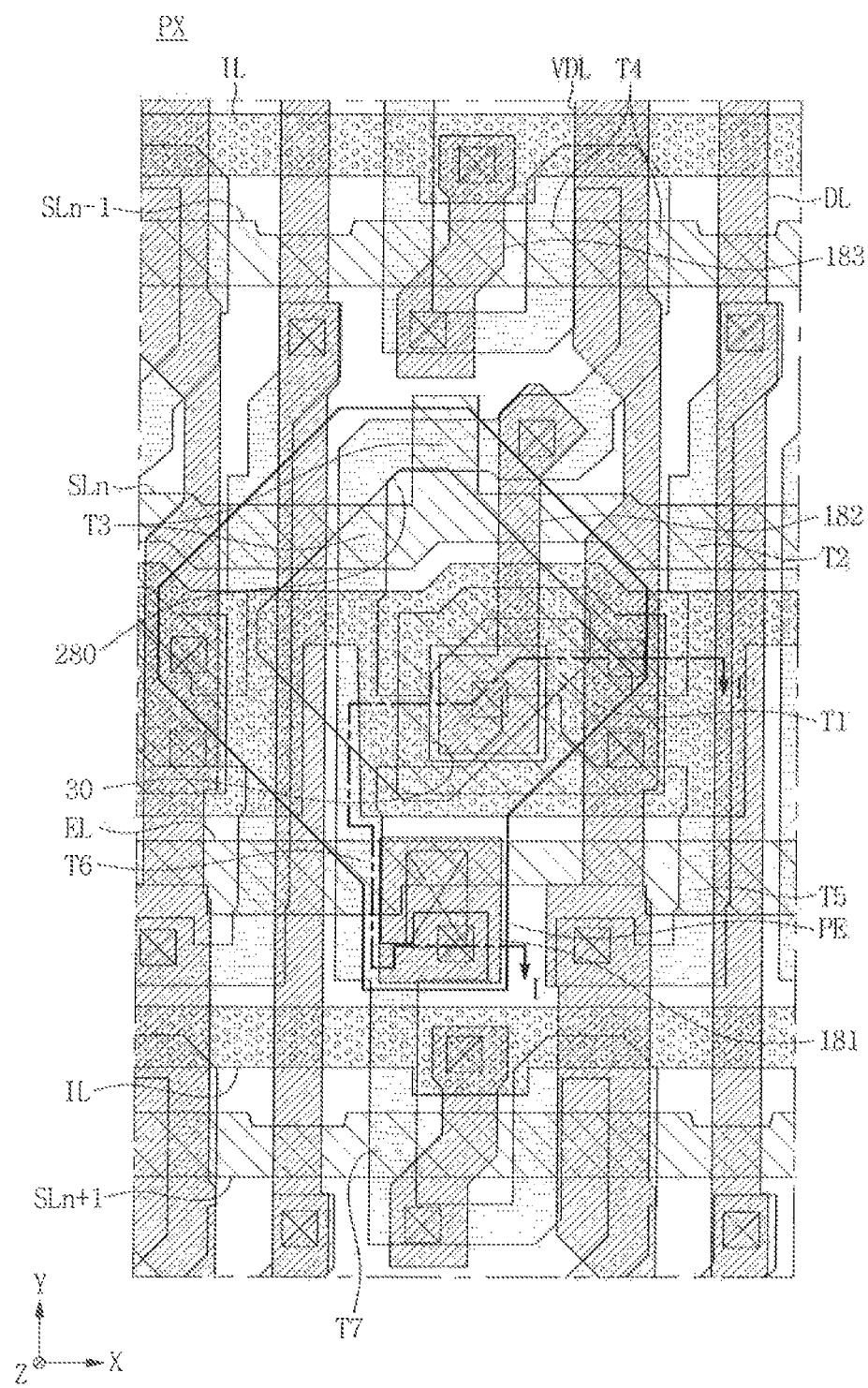
FIG. 3 is a detailed plan view of a display device that includes a pixel of FIG. 1 and lines connected thereto.
Figure 4A:
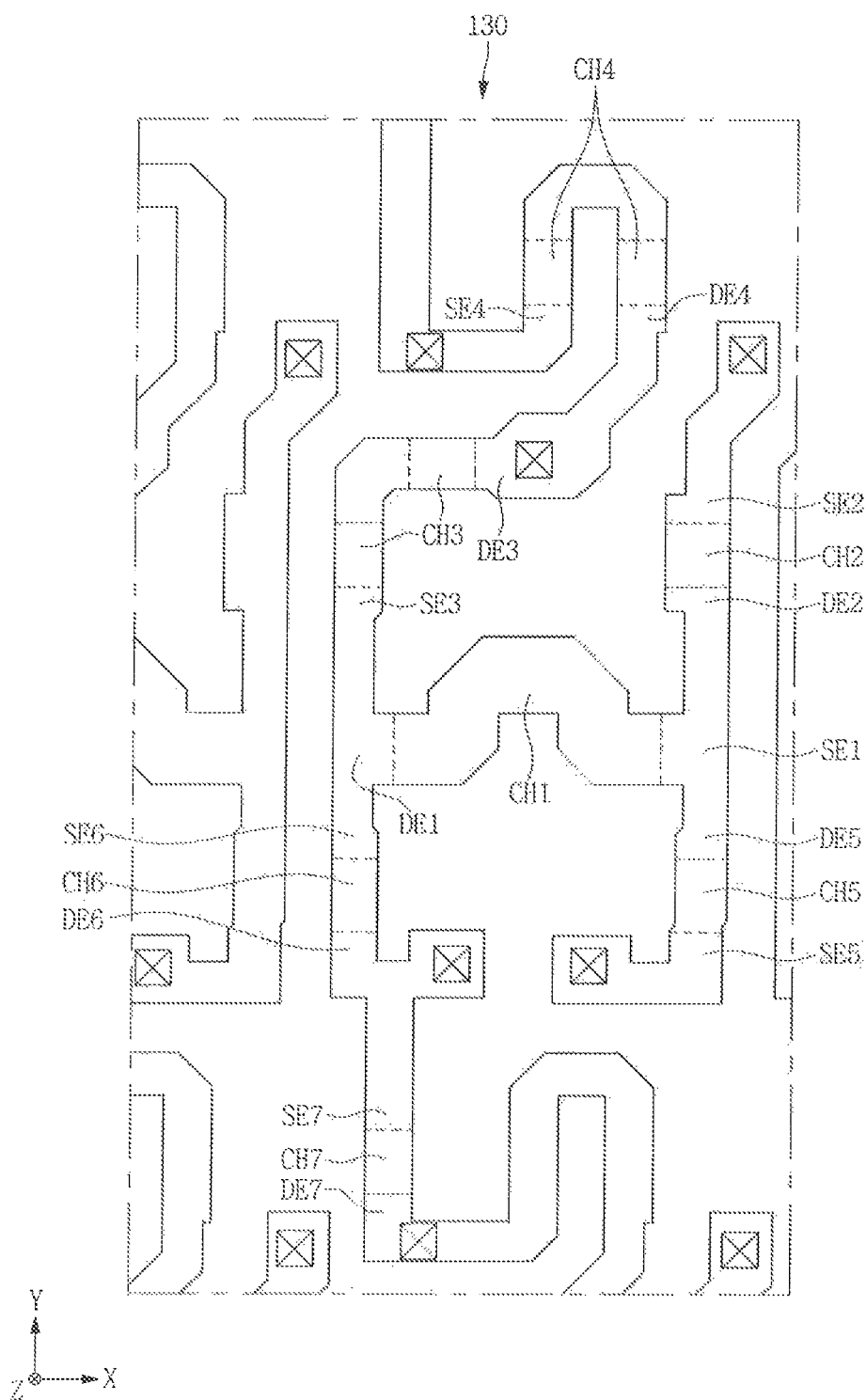
FIGS. 4A, 4B, 4C, 4D, 4E and 4F separately illustrate a part of the components of FIG. 3.
Figure 4B:
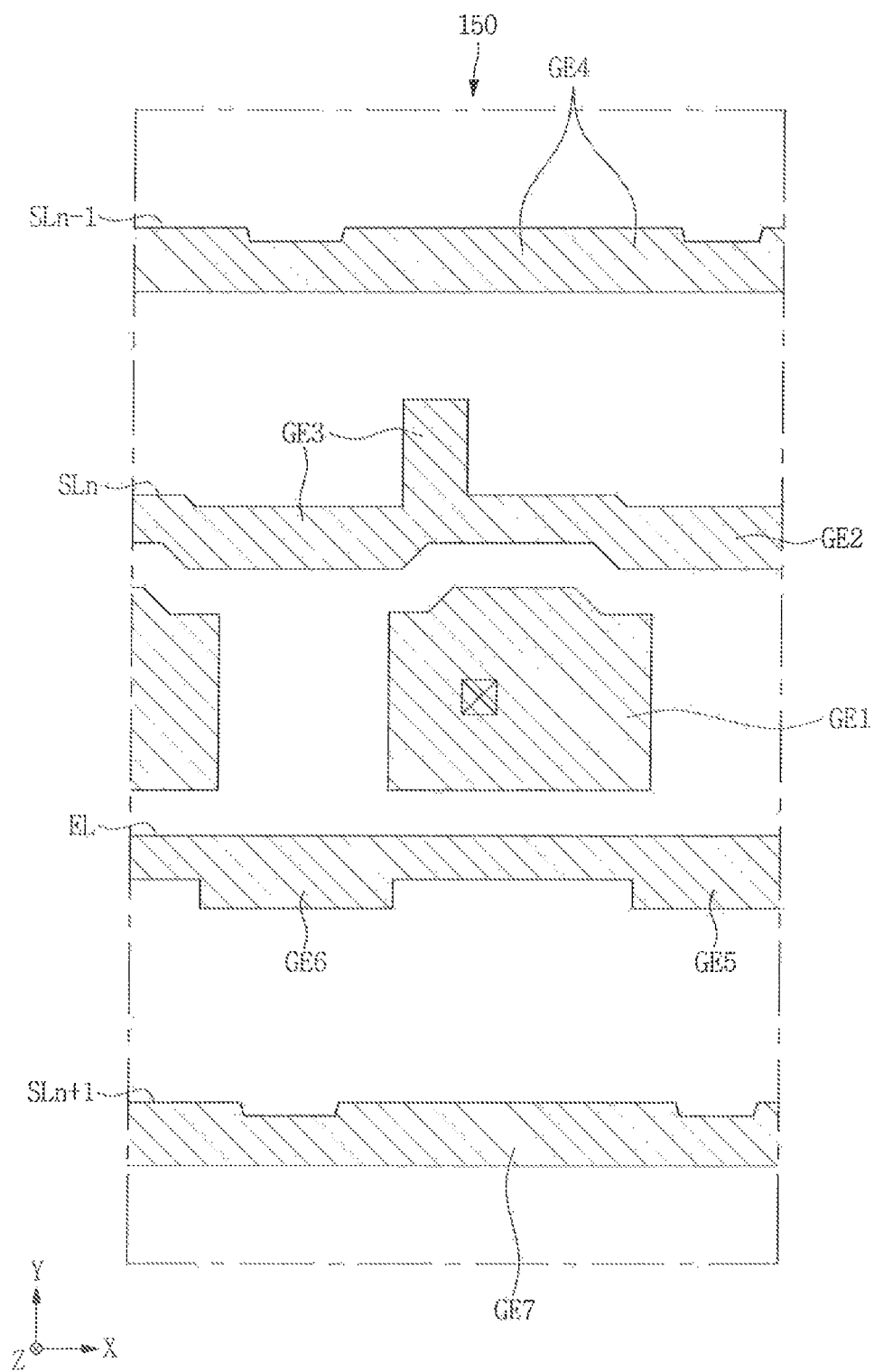
Figure 4C:
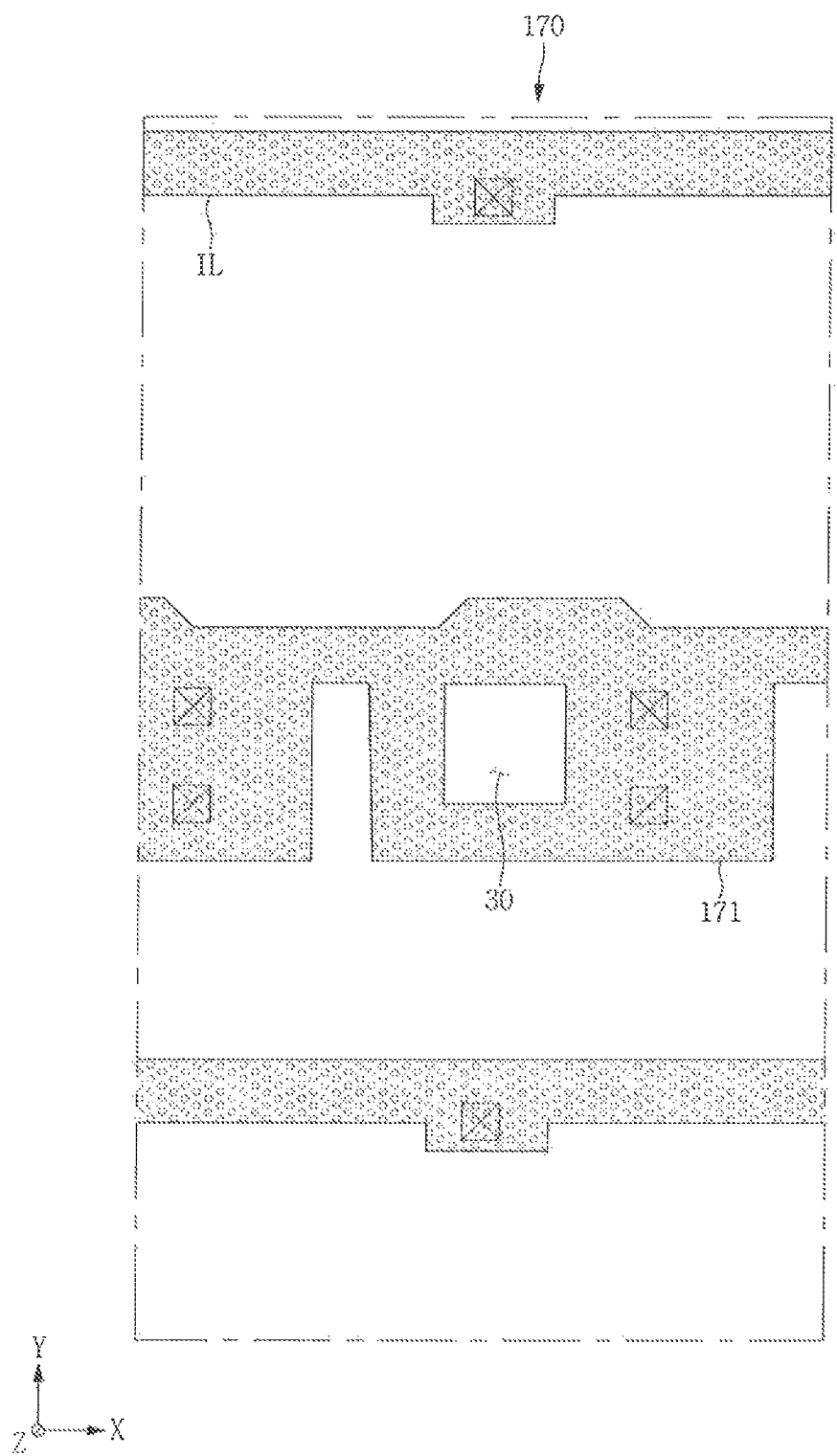
Figure 4D:
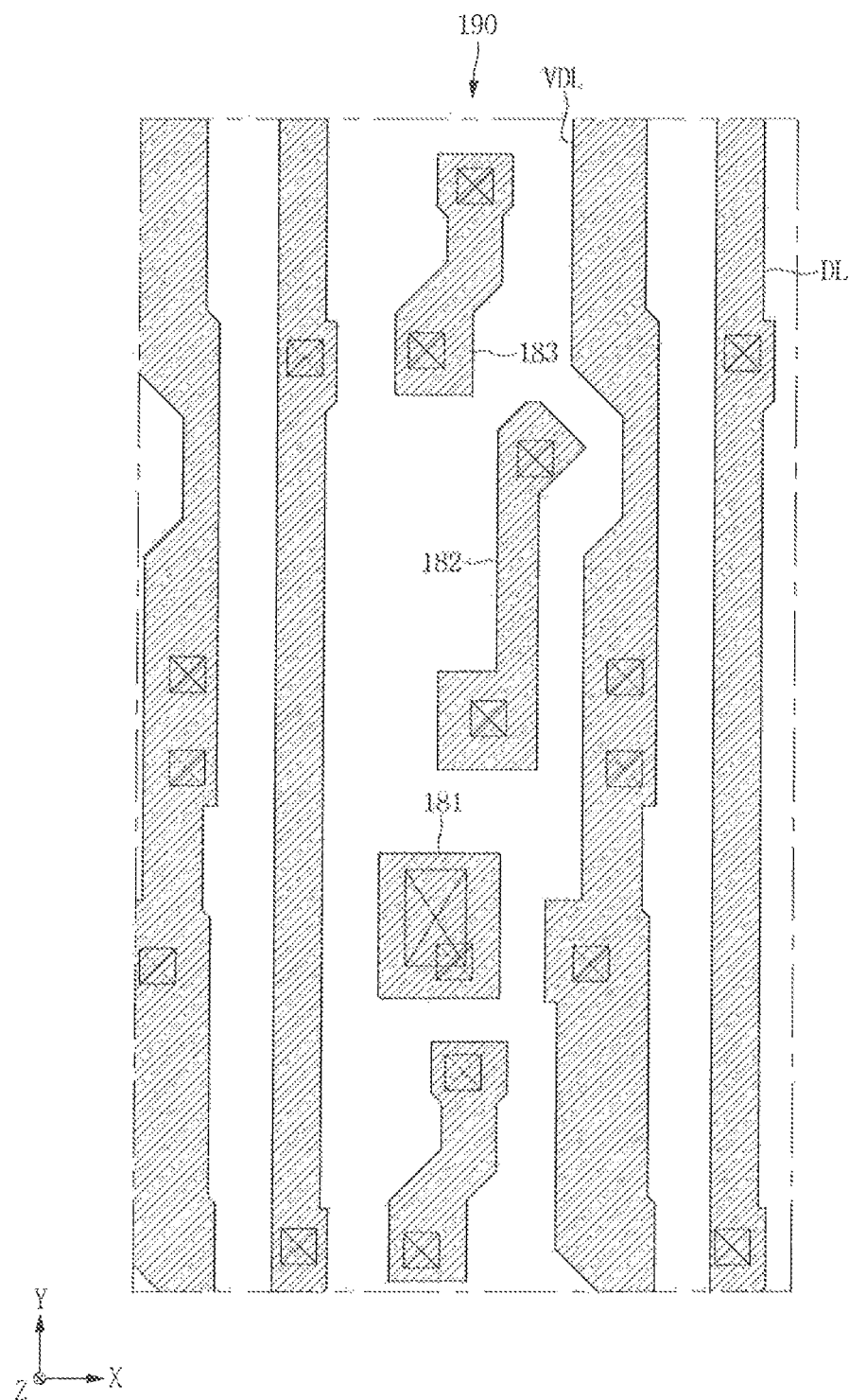
Figure 4E:
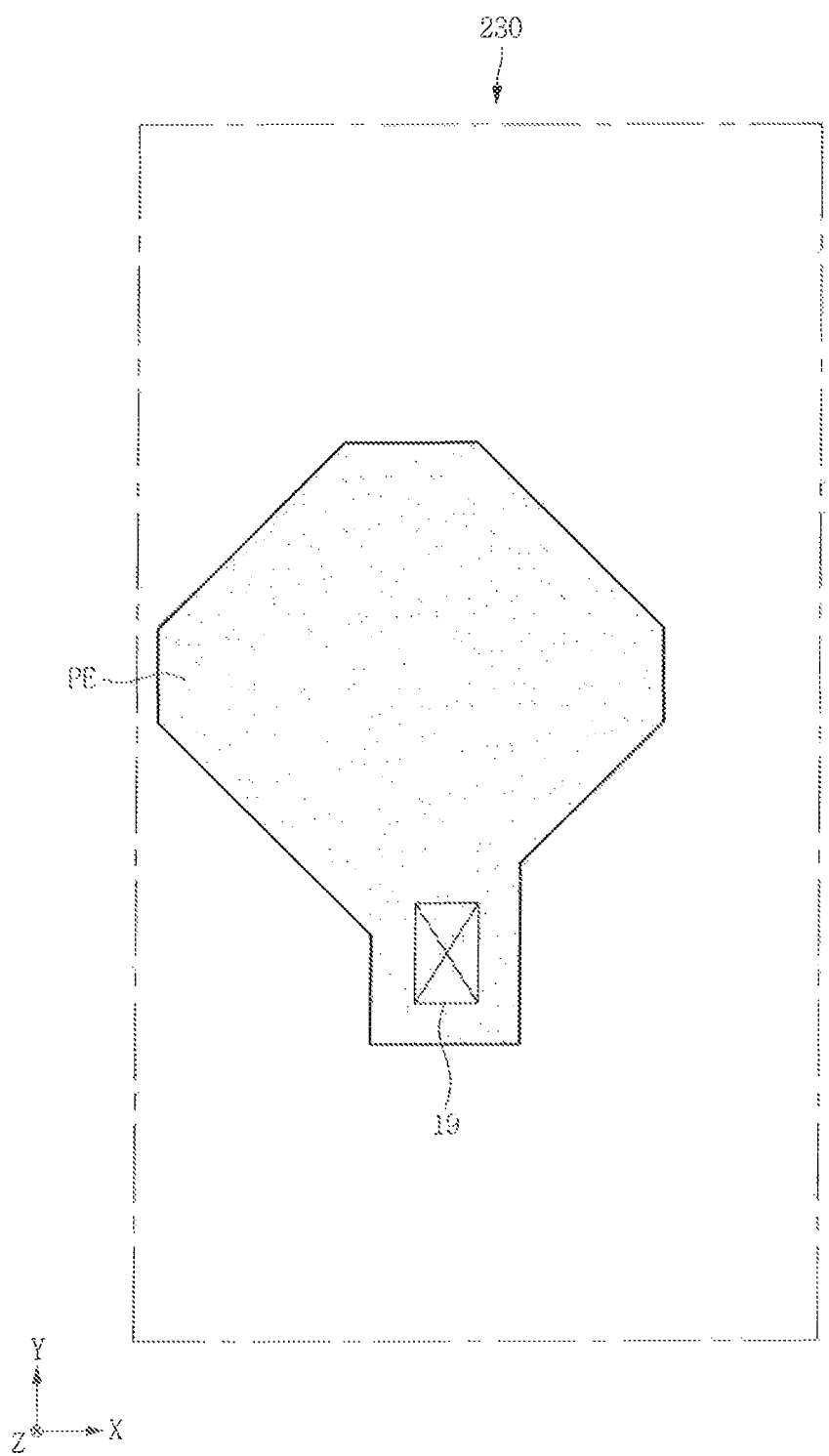
Figure 4F:
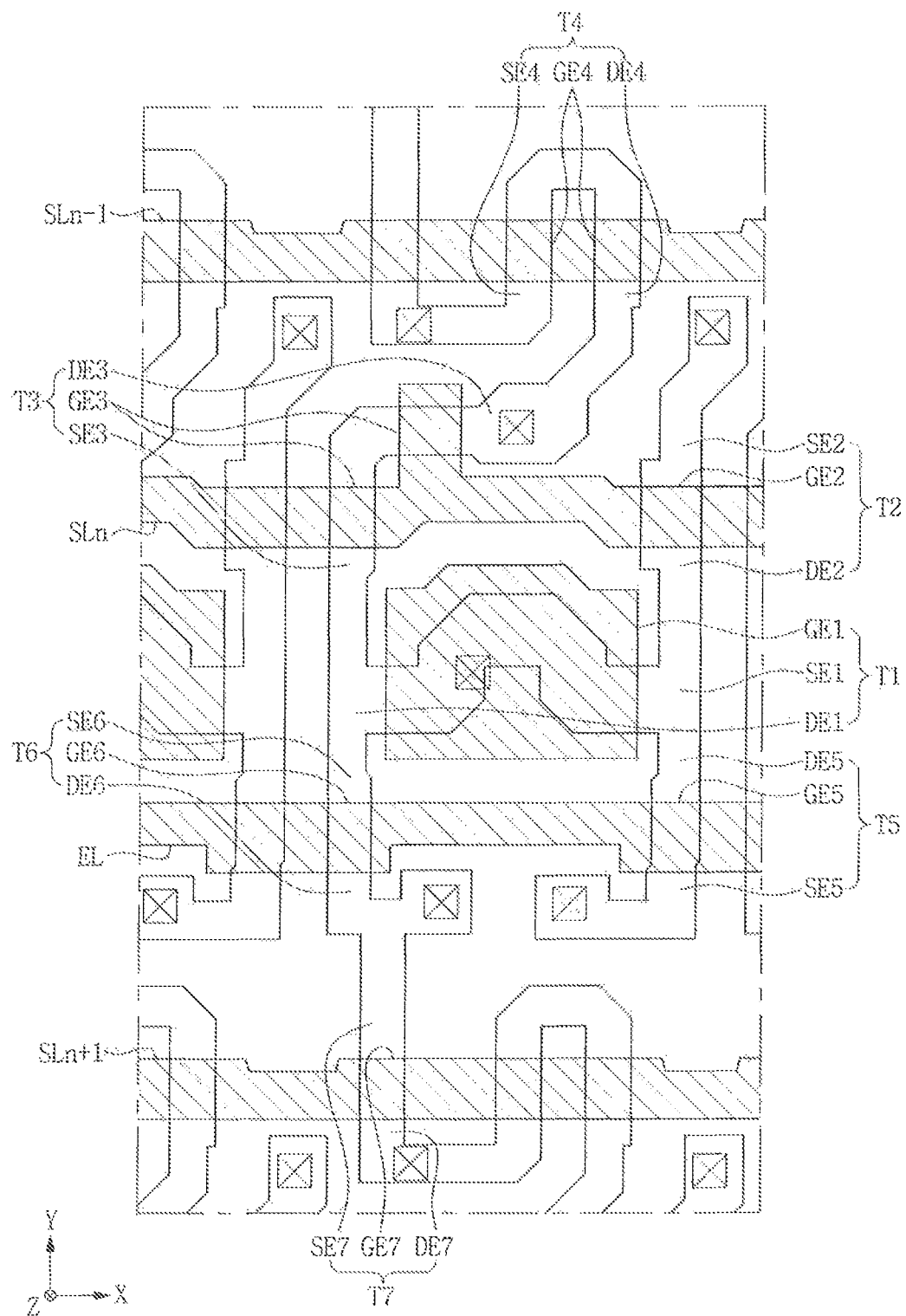
Figure 5:
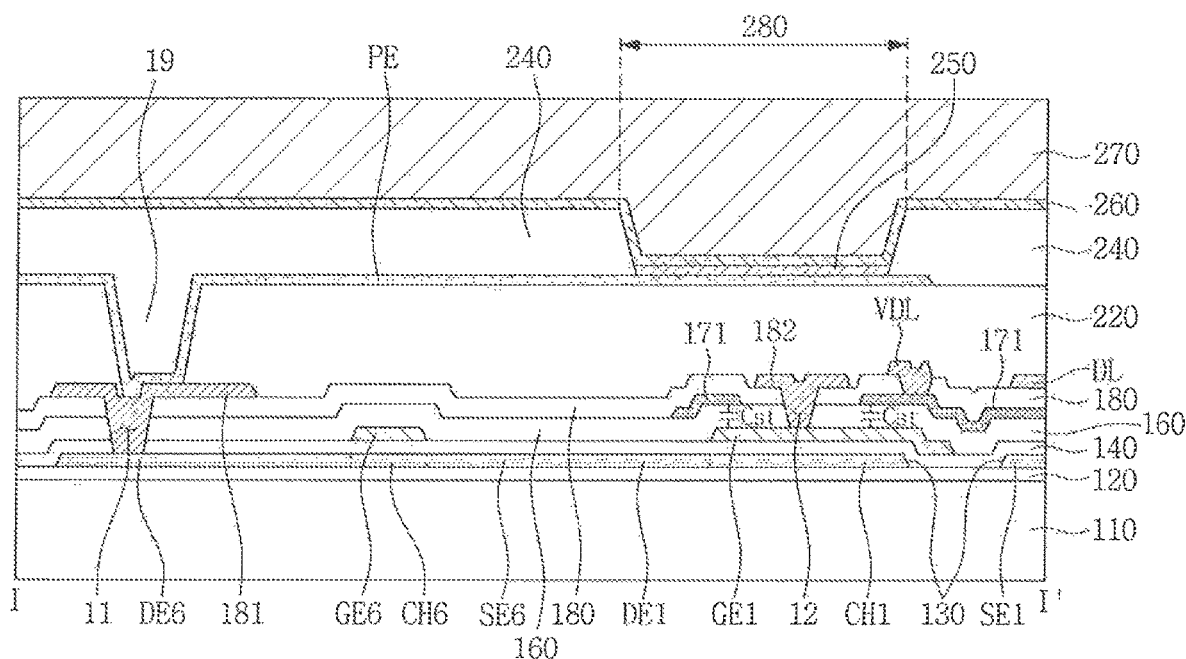
FIG. 5 is a cross-sectional view taken along line I-I' of FIG. 3.

FIG. 3 is a detailed plan view of a display device that includes a pixel of FIG. 1 and lines connected thereto, FIGS. 4A, 4B, 4C, 4D, 4E and 4F separately illustrate a part of the components of FIG. 3 and FIG. 5 are cross-sectional views taken along the line I-I' of FIG. 3.

According to an embodiment, FIG. 4A illustrates a semiconductor layer 130 of FIG. 3, FIG. 4B illustrates an (n−1)-th scan line SLn−1, an n-th scan line SLn, an (n+1)-th scan line SLn+1 and a light emission control line EL, FIG. 4C illustrates an initialization line IL and a capacitor electrode 171 of FIG. 3, FIG. 4D illustrates the data line DL and the high potential line VDL of FIG. 3, FIG. 4E illustrates a pixel electrode PE of FIG. 3 and FIG. 4F illustrates the semiconductor layer 130, the (n−1)-th scan line SLn−1, the n-th scan line SLn, the (n+1)-th scan line SLn+1 and the light emission control line EL of FIG. 3.

As illustrated in FIGS. 3, 4b and 5, a display device according to an exemplary embodiment includes a substrate 110, a buffer layer 120, a semiconductor layer 130, a gate insulating layer 140, gate electrodes GE1, GE2, GE3, GE4, GE5, GE6 and GE7, an (n−1)-th scan line SLn−1, an n-th scan line SLn, an (n+1)-th scan line SLn+1, a light emission control line EL, a first insulating interlayer 160, an initialization line IL, a capacitor electrode 171, a second insulating interlayer 180, a first connection electrode 181, a second connection electrode 182, a third connection electrode 183, a data line DL, a high potential line VDL, a planarization layer 220, a pixel electrode PE, a light blocking layer 240, a light emitting layer 250, a common electrode 260 and a sealing member 270.

According to an embodiment, the substrate 110 illustrated in FIG. 5 is a transparent insulating substrate that includes glass or transparent plastic. For example, the substrate 110 may include one of kapton, polyethersulphone (PES), polycarbonate (PC), polyimide (PI), polyethyleneterephthalate (PET), polyethylene naphthalate (PEN), polyacrylate (PAR), fiber reinforced plastic (FRP), etc.

According to an embodiment, as illustrated in FIG. 5, the buffer layer 120 is disposed on the substrate 110. The buffer layer 120 is disposed over an entire surface of the substrate 110. The buffer layer 120 can prevent permeation of undesirable elements and planarizes a surface therebelow and includes materials suitable for planarizing or preventing permeation. For example, the buffer layer 120 may include one of a silicon nitride ($SiN_x$) layer, a silicon oxide ($SiO_2$) layer or a silicon oxynitride ($SiO_xN_y$) layer. However, in other embodiments the buffer layer 120 may be omitted depending on the type of the substrate 110 and process conditions thereof.

According to an embodiment, as illustrated in FIG. 5, the semiconductor layer 130 is disposed on the buffer layer 120.

According to an embodiment, as illustrated in FIG. 4A, the semiconductor layer 130 provides respective channel areas CH1, CH2, CH3, CH4, CH5, CH6 and CH7 of the first, second, third, fourth, fifth, sixth and seventh thin film transistors T1, T2, T3, T4, T5, T6 and T7. In addition, the semiconductor layer 130 provides source electrodes SE1, SE2, SE3, SE4, SE5, SE6 and SE7 and drain electrodes DE1, DE2, DE3, DE4, DE5, DE6 and DE7 of respective first, second, third, fourth, fifth, sixth and seventh thin film transistors T1, T2, T3, T4, T5, T6 and T7.

According to an embodiment, the semiconductor layer 130 includes at least one of a polycrystalline silicon layer, an amorphous silicon layer or an oxide semiconductor such as indium gallium zinc oxide (IGZO) or indium zinc tin oxide (IZTO). For example, when the semiconductor layer 130 includes a polycrystalline silicon layer, the semiconductor layer 130 includes a channel area which is not doped with impurities and source and drain electrodes formed on opposite sides of the channel area and doped with impurity ions.

According to an embodiment, as illustrated in FIG. 5, the gate insulating layer 140 is disposed on the semiconductor layer 130 and the buffer layer 120. The gate insulating layer 140 includes at least one of tetraethylorthosilicate (TEOS), silicon nitride ($SiN_x$) or silicon oxide ($SiO_2$). For example, the gate insulating layer 140 may have a double-layer structure where an about 40 nm thick $SiN_x$ layer is sequentially stacked on an about 80 nm thick TEOS layer.

According to an embodiment, as illustrated in FIG. 5, the first gate electrode GE1 is disposed on the gate insulating layer 140. The first gate electrode GE1 is positioned between the gate insulating layer 140 and the first insulating interlayer 160.

According to an embodiment, the scan lines and the light emission control line are disposed on the gate insulating layer. For example, the (n−1)-th scan line SLn−1, the n-th scan line SLn, the (n+1)-th scan line SLn+1 and the light emission control line EL are positioned between the gate insulating layer 140 and the first insulating interlayer 160.

According to an embodiment, the scan line SL (e.g., at least one of the (n−1)-th scan line SLn−1, the n-th scan line SLn, the (n+1)-th scan line SLn+1) include aluminum (Al) or alloys thereof, silver (Ag) or alloys thereof, copper (Cu) or alloys thereof, or molybdenum (Mo) or alloys thereof. Alternatively, the scan line SL includes one of chromium (Cr) or tantalum (Ta). In an exemplary embodiment, the scan line SL has a multilayer structure that includes at least two conductive layers that have different physical properties.

In addition, according to an embodiment, the light emission control line EL includes substantially a same material and have substantially a same structure, such as a multilayer structure, as those of the scan line SL. The light emission control line EL and the scan line SL substantially simultaneously formed in substantially a same process.

According to an embodiment, as illustrated in FIG. 5, the first insulating interlayer 160 is disposed on the first gate electrode GE1 and the gate insulating layer 140. The first insulating interlayer 160 has a thickness greater than a thickness of the gate insulating layer 140. The first insulating interlayer 160 includes a material that is substantially the same as a material included in the gate insulating layer 140 described above.

According to an embodiment, as illustrated in FIG. 5, the capacitor electrode 171 is disposed on the first insulating interlayer 160. The capacitor electrode 171 together with the first gate electrode GE1 described above form a storage capacitor Cst. As illustrated in FIGS. 3 and 4C, the capacitor electrode 171 has a hole 30.

According to an embodiment, the initialization line IL, shown in FIGS. 3 and 4C, is also disposed on the first insulating interlayer 160. For example, the initialization line IL is located between the first insulating interlayer 160 and the second insulating interlayer 180.

According to an embodiment, as illustrated in FIG. 5, the second insulating interlayer 180 is disposed on the capacitor electrode 171 and the first insulating interlayer 160. The second insulating interlayer 180 has a thickness greater than a thickness of the gate insulating layer 140. The second insulating interlayer 180 includes a material substantially the same as a material included in the gate insulating layer 140 described above.

According to an embodiment, as illustrated in FIG. 5, the first connection electrode 181, the second connection electrode 182, the high potential line VDL and the data line DL are disposed on the second insulating interlayer 180.

According to an embodiment, the data line DL includes a refractory metal, such as molybdenum, chromium, tantalum and titanium, or an alloy thereof. The data line DL has a multilayer structure that includes a refractory metal layer and a low-resistance conductive layer. Examples of a multilayer structure include a double-layer structure that includes a chromium or molybdenum (alloy) lower layer and an aluminum (alloy) upper layer; or a triple-layer structure that includes a molybdenum (alloy) lower layer, an aluminum (alloy) intermediate layer and a molybdenum (alloy) upper layer. In an exemplary embodiment, the data line DL can include or be formed of any suitable metal or conductor other than the aforementioned materials.

According to an embodiment, as illustrated in FIG. 5, the planarization layer 220 is disposed on the first connection electrode 181, the second connection electrode 182, the high potential line VDL and the data line DL.

According to an embodiment, the planarization layer 220 can planarize the substrate 110 by eliminating height differences of the substrate 110 to increase luminous efficiency of the OLED to be formed thereon. The planarization layer 220 includes one or more of the following materials: a polyacrylate resin, an epoxy resin, a phenolic resin, a polyamide resin, a polyimide resin, an unsaturated polyester resin, a polyphenylen ether resin, a polyphenylene sulfide resin or benzocyclobutene (BCB).

According to an embodiment, as illustrated in FIG. 5, the pixel electrode PE is disposed on the planarization layer 220. At least a portion of the pixel electrode PE is disposed in a light emission area 280. That is, the pixel electrode PE is positioned to correspond to a light emission area 280 defined by the light blocking layer 240, described below. The pixel electrode PE is connected to the first connection electrode 181 through a contact hole 19 that penetrates through the planarization layer 220.

According to an embodiment, as illustrated in FIG. 5, the light blocking layer 240 is located on the pixel electrode PE and the planarization layer 220. The light blocking layer 240 has an opening therethrough that corresponds to the light emission area 280.

According to an embodiment, the light blocking layer 240 includes a resin such as a polyacrylate resin or a polyimide resin.

According to an embodiment, the light emitting layer 250 is disposed on the pixel electrode PE in the light emission area 280 and the common electrode 260 is disposed on the light blocking layer 240 and the light emitting layer 250. The pixel electrode PE, the light emitting layer 250 and the common electrode 260 constitute a light emitting diode, such as the OLED of FIG. 2. In such an exemplary embodiment, the pixel electrode PE corresponds to an anode electrode of the OLED and the common electrode 260 corresponds to a cathode electrode of the OLED.

According to an embodiment, the light emitting layer 250 may include a low molecular weight organic material or a high molecular weight organic material. In addition, at least one of a hole injection layer HIL or a hole transport layer HTL can be further provided between the pixel electrode PE and the light emitting layer 250 and at least one of an electron transport layer ETL or an electron injection layer EIL can be further provided between the light emitting layer 250 and the common electrode 260.

According to an embodiment, the pixel electrode PE and the common electrode 260 can be one of a transmissive electrode, a transflective electrode or a reflective electrode.

According to an embodiment, a transparent conductive oxide ("TCO") is used to form a transmissive electrode. A TCO includes at least one of indium tin oxide (ITO), indium zinc oxide (IZO), antimony tin oxide (ATO), aluminum zinc oxide (AZO), zinc oxide (ZnO) or mixtures thereof.

According to an embodiment, a metal, such as magnesium (Mg), silver (Ag), gold (Au), calcium (Ca), lithium (Li), chromium (Cr), aluminum (Al) or copper (Cu), or an alloy thereof, is used to form a transflective electrode and a reflective electrode. In such an exemplary embodiment, whether an electrode is a transflective type or a reflective type depends on the thickness of the electrode. Typically, a transflective electrode has a thickness of about 200 nm or less and a reflective electrode has a thickness of about 300 nm or more. As the thickness of a transflective electrode decreases, light transmittance increases. On the contrary, as the thickness of the transflective electrode increases, light transmittance decreases.

In addition, according to an embodiment, a transflective electrode and a reflective electrode have a multilayer structure that includes a metal layer and a TCO layer stacked thereon.

According to an embodiment, the sealing member 270 is disposed on the common electrode 260. The sealing member 270 includes a transparent insulating material such as glass, transparent plastic, etc. In addition, the sealing member 270 has a thin film encapsulation structure in which one or more inorganic layers and one or more organic layers are alternately laminated along a Z-axis direction.

In an exemplary embodiment, as illustrated in FIG. 5, a plurality of patterns are disposed vertically on different layers between the substrate 110 and the pixel electrodes PE. For example, the plurality of patterns are disposed on different layers along the Z-axis direction between the substrate 110 and the pixel electrodes PE, which will be described below in detail.

According to an embodiment, the semiconductor layer 130 of FIG. 4A is a first pattern 130, each of the scan lines SLn−1, SLn and SLn+1, each of the gate electrodes GE1, GE2, GE3, GE4, GE5, GE6 and GE7 and the light emission control line EL of FIG. 4B form a second pattern 150, the initialization line 1L and the capacitor electrode 171 of FIG. 4C form a third pattern 170, each of the connection electrodes 181, 182 and 183, the high potential line VDL and the data line DL of FIG. 4D form a fourth pattern 190, and the pixel electrode PE of FIG. 4E forms a fifth pattern 230. The gate insulating layer 140, the first insulating interlayer 160, the second insulating interlayer 180 and the planarization layer 220 are disposed between each of the corresponding patterns.

In addition, according to an exemplary embodiment to be described below, the display panel 101 further includes a sixth pattern. For example, a third insulating interlayer 200 to be described below is further disposed on the fourth pattern 190 and the sixth pattern is disposed between the third insulating interlayer 200 and the planarization layer 220, but exemplary embodiments are not limited thereto. The third insulating interlayer 200 and the sixth pattern on the third insulating interlayer 200 may be disposed between the first pattern 130 and the gate insulating layer 140, between the second pattern 150 and the first insulating interlayer 160, or between the third pattern 170 and the second insulating interlayer 180. The sixth pattern includes a scan line, a high potential power line, a bypass line, etc., which will be described below.

According to an embodiment, the third insulating interlayer 200 includes a material substantially the same as a material included in the gate insulating layer 140, the first insulating interlayer 160, or the second insulating interlayer 180.

According to an embodiment, components included in a same pattern all include a substantially same material and are disposed on substantially a same layer. Components in different patterns are disposed on different layers. For example, the semiconductor layer 130 included in the first pattern 130 is disposed on a different layer from a layer on which the light emission control line EL in the second pattern 150 is disposed. For example, the light emission control line EL is disposed on a layer closer to the pixel electrode PE than a layer on which the semiconductor layer 130 is disposed.

Figure 6:
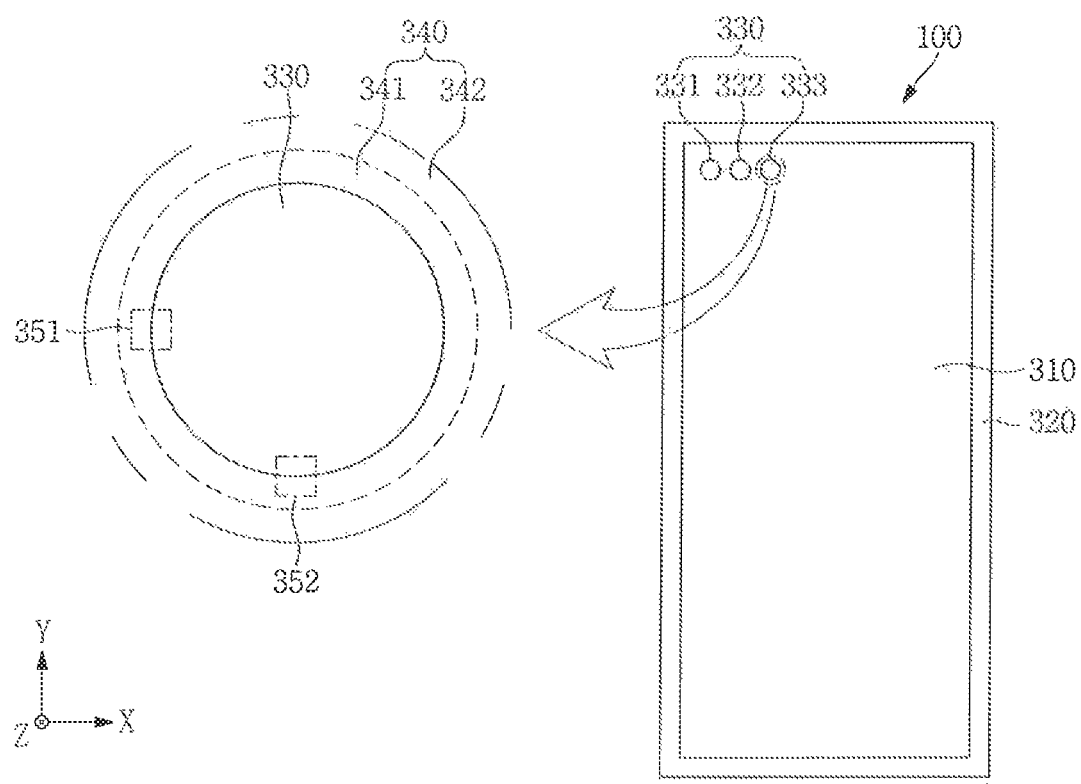
FIG. 6 is a plan view of a display device according to an exemplary embodiment.

FIG. 6 is a plan view that illustrates a display device according to an exemplary embodiment.

Referring to FIG. 6, the display panel 101 of the display device 100 according to an exemplary embodiment includes the substrate 110 with a display area 310 and a non-display area 320 at an edge of the display area 310. The display area 310 is an area in which an input image is displayed and includes pixels PX in a matrix form, which are partitioned by scan lines and data lines that cross each other. In the non-display area 320, a plurality of driving elements for transmitting driving signals to the display area 310 are disposed. For example, the non-display area 320 includes the scan driver 102, the data driver 104 and various lines connected to the pixels PX for driving the pixels PX in the display area 310.

As illustrated in FIG. 6, according to an embodiment, the non-display area 320 that surrounds the display area 310 is disposed at the edge of a front surface and is covered by a bezel. Alternatively, the display area 310 can be expanded to the entirety of the front surface of the display device or to one or more side surfaces of the display device, and thus there may be no non-display area 320 or bezel on the front surface. In addition, no pixels PX are disposed in the non-display area 320. However, exemplary embodiments are not limited thereto and there may be pixels PX disposed in the non-display area 320 as well.

In an exemplary embodiment, at least one sensor is disposed that overlaps the display area 310 of the substrate 110. The sensor area 330 is an area of the display area 310 that overlaps the sensor. The sensor area 330 is located in the display area 310. The sensor area 330 is surrounded by the display area 310 and the sensor area 330 is located at one side of the display area 310 as well. In FIG. 6, the sensor area 330 is depicted as having a substantially circular shape, but exemplary embodiments are not limited thereto. The sensor area 330 may have a polygonal shape, an elliptical shape, a linear shape, etc.

In an exemplary embodiment, the sensor is at least one of a proximity sensor, an illumination sensor, an RGB sensor, an infrared sensor, a finger scan sensor, an ultrasonic sensor, an optical sensor, such as a camera, a microphone, an environmental sensor, such as a barometer, a hygrometer, a thermometer, a radiation sensor, a heat sensor, a gas sensor, etc., or a chemical sensor, such as an electronic nose, a healthcare sensor, a biometric sensor, etc.

According to an exemplary embodiment, the sensor area 330 transmits a signal, such as sound or light, to the sensor. An open hole, referred to hereinafter as a penetrating sensor area, is provided which physically penetrates through the display panel 101 or the substrate 110 at the sensor area 330 so that the signal can pass therethrough. In such an exemplary embodiment, as will be described below, lines, such as scan lines, data lines or power lines, which cross the sensor area 330 are divided into a plurality of line groups and a bypass line is provided that bypasses the sensor area 330 to connect the divided line groups.

According to another exemplary embodiment, the display panel 101 has a non-penetrating sensor area at the sensor area 330 that does not physically penetrate the display panel 101 or substrate 110 and through which a signal can be transmitted. In such an exemplar exemplary embodiment, the scan lines, data lines, and power lines, etc., cross the sensor area without being divided into groups, thereby substantially minimizing interference with signals propagating through the sensor area 330.

Although exemplary embodiments of the present disclosure have been described with respect to a non-penetrating sensor area, exemplary embodiments can incorporate a penetrating sensor area unless otherwise specified.

In an exemplary embodiment, a wiring connection area 340 is located between the sensor area 330 and the display area 310. Lines that extend from the display area 310 and lines that extend from the sensor area 330 are connected to each other at the wiring connection area 340. For example, two lines can be connected to each other in a straight line, two lines that extend in different directions can be connected to each other, two parallel lines are connected to each other using another line which crosses the two parallel lines, and two lines disposed in different layers with an insulating layer therebetween are connected to each other through a contact hole in the insulating layer. As used herein, one line can be understood to include a plurality of lines connected to each other to transmit the same signal or the same power voltage.

In addition, in an exemplary embodiment, a dummy pixel can be disposed at the wiring connection area 340 between the sensor area 330 and the display area 310. More specifically, the wiring connection area 340 includes an area 341 adjacent to the sensor area 330 and an area 342 adjacent to the display area 310, and the dummy pixel is disposed in the area 342 adjacent to the display area 310. The dummy pixel increases the uniformity of the substrate and substantially prevents damage to a pixel PX adjacent to the sensor area 330.

Figure 7:
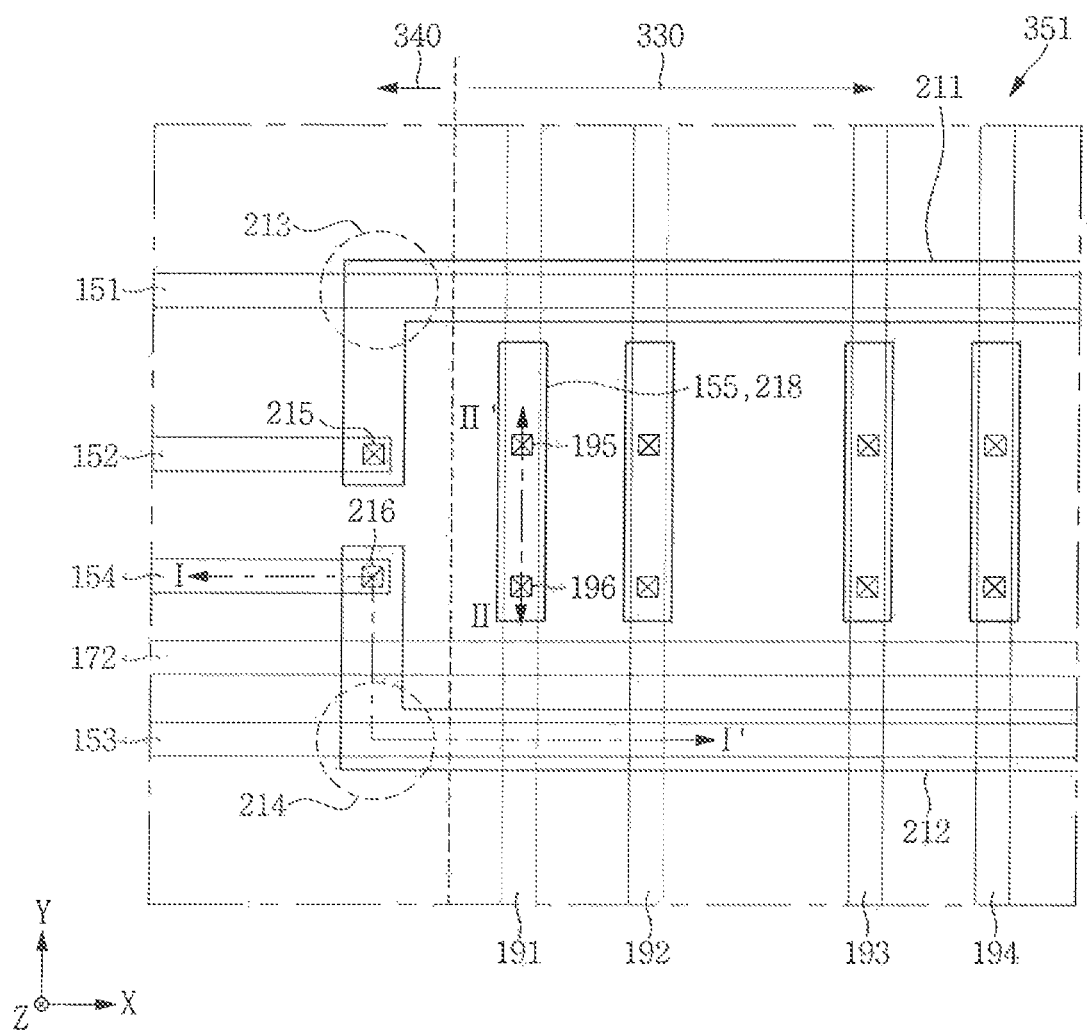
FIG. 7 is an enlarged view of an area where a wiring connection area meets a sensor area in an X-axis direction, according to an exemplary embodiment.
Figure 8:
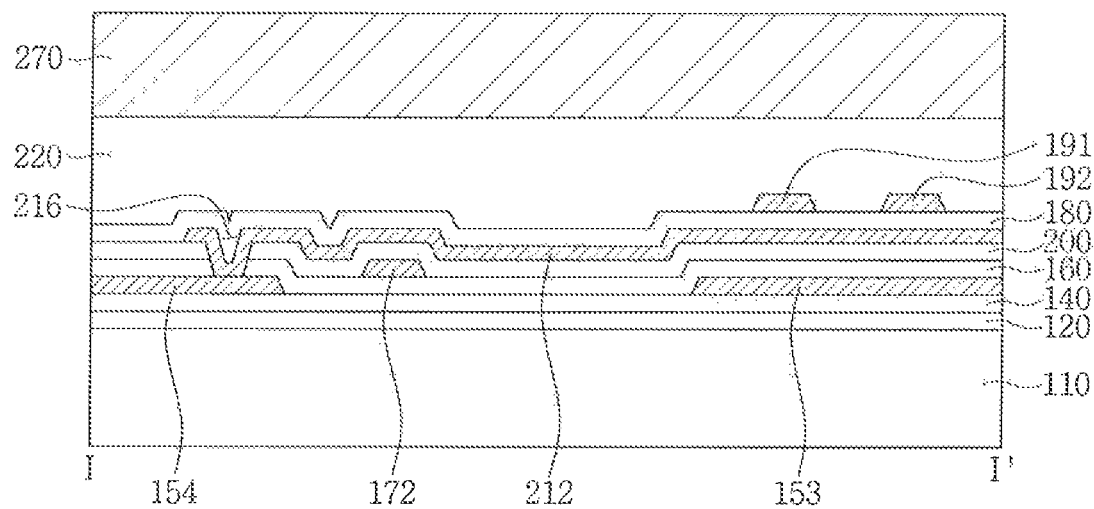
FIGS. 8, 9 and 10 are cross-sectional views taken along line I-I' of FIG. 7 according to an exemplary embodiment.
Figure 9:
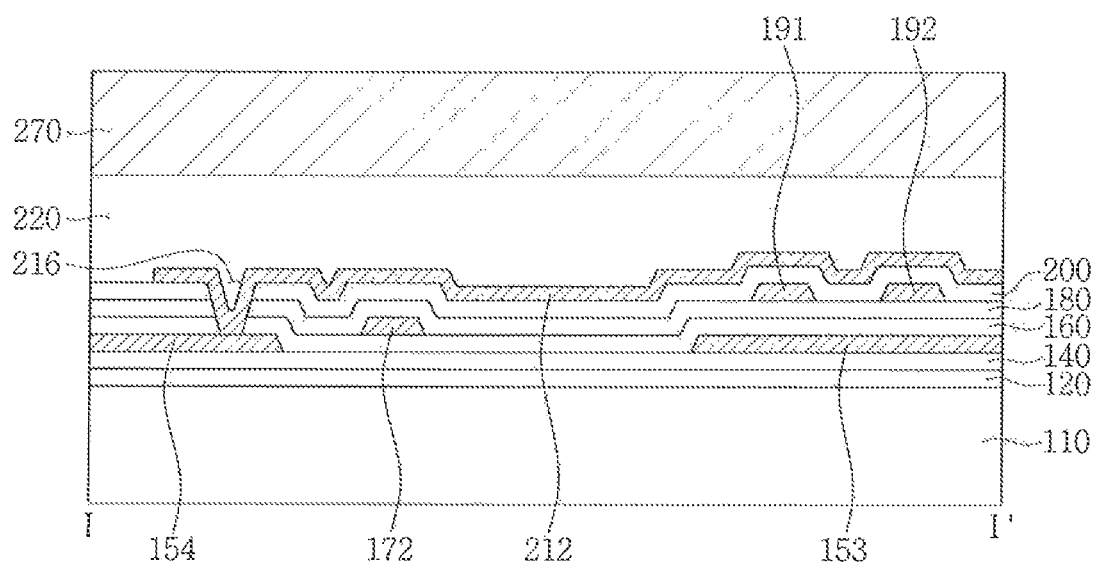
Figure 10:
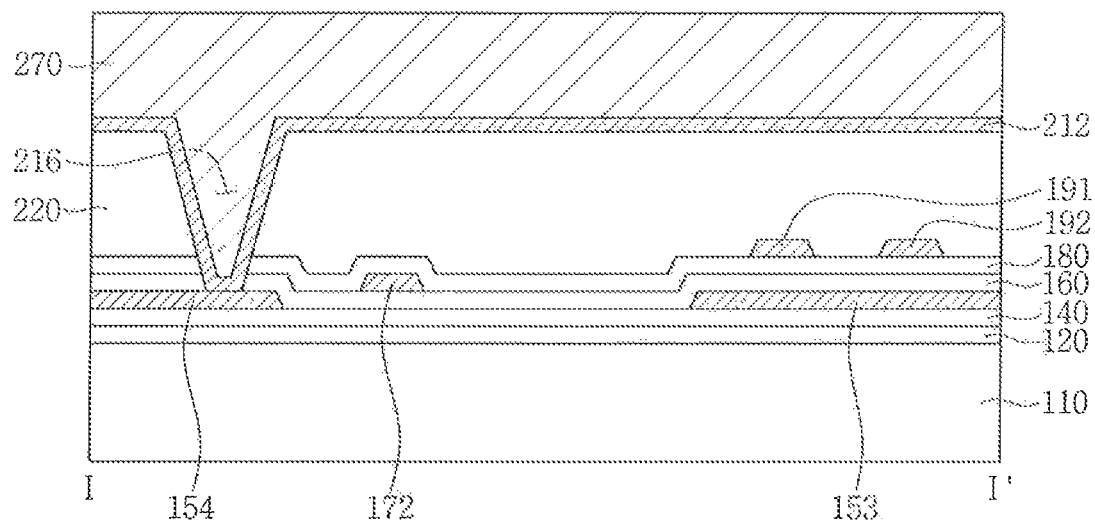

FIG. 7 is an enlarged view of an area 351 of FIG. 6 where a wiring connection area meets a sensor area in an X-axis direction according to an exemplary embodiment, and FIGS. 8, 9 and 10 are cross-sectional views each taken along line I-I' of FIG. 7. More specifically, FIG. 7 is a plan view common to exemplary embodiments described below and FIGS. 8, 9 and 10 are cross-sectional views that respectively illustrate exemplary embodiments.

As illustrated in FIG. 7, according to an exemplary embodiment, four X-axis direction lines 151, 152, 153 and 154 and four Y-axis direction lines 191, 192, 193 and 194 extend from the display area to cross a sensor area 330. The X-axis direction lines 151, 152, 153 and 154 illustrated in FIG. 7 may be scan lines SLn−1, SLn and SLn+1 and a light emission control line EL, respectively. Hereinafter, the scan lines SL will include the light emission control line EL. In addition, the Y-axis direction lines 191 and 193 may be data lines DL and the Y-axis direction lines 192 and 194 may be high potential lines VDL. However, exemplary embodiments are not limited thereto and embodiments can include any plurality of lines arranged parallel to each other in substantially a same layer in the display area 310 and that extend into the sensor area 330.

Hereinafter, according to an exemplary embodiment, it is assumed that four scan lines 151, 152, 153 and 154 that extend in the X-axis direction and two data lines 191 and 193 and two high potential lines 192 and 194 that extend in the Y-axis direction extend from the display area 310 into the wiring connection area 340. In addition, a display device 100 according to an exemplary embodiment includes two auxiliary scan lines. As illustrated in FIG. 7, two scan lines 151 and 153 of the four scan lines 151, 152, 153 and 154 overlap two auxiliary scan lines 211 and 212, respectively, with an insulating layer therebetween. Hereinafter, such exemplary embodiments will be described in detail.

Hereinafter, an exemplary embodiment will be described more specifically with reference to FIGS. 7 and 8. Herein, detailed descriptions of components of the display area that have been described above will be omitted.

In an exemplary embodiment, a substrate 110, a buffer layer 120 and a gate insulating layer 140 are disposed at a wiring connection area 340 and a sensor area 330 in a display area 310. However, there may be no semiconductor layer 130, gate electrodes GE1, GE2, GE3, GE4, GE5, GE6 and GE7, etc formed in the wiring connection area 340 and the sensor area 330.

In an exemplary embodiment, at least a part 151 and 153 of scan lines 151, 152, 153 and 154 extend from the display area 310 into the sensor area 330 in the X-axis direction. On the other hand, another part 152 and 154 of the scan lines 151, 152, 153 and 154 extend from the display area 310 into the wiring connection area 340 but do not extend into the sensor area 330.

In an exemplary embodiment, a first insulating interlayer 160 is disposed on the scan lines 151, 152, 153 and 154 and an initialization lines (IL) 172 is disposed on the first insulating interlayer 160, as in the display area 310. However, no capacitor electrode 171 is disposed at the sensor area 330.

According to an exemplary embodiment, a third insulating interlayer 200 is disposed on the initialization line 172, and contact holes 215 and 216 are formed in the first insulating interlayer 160 and the third insulating interlayer 200 to expose the scan lines 152 and 154 in the wiring connection area 340.

According to an exemplary embodiment, auxiliary scan lines 211 and 212 are disposed on the third insulating interlayer 200. The auxiliary scan lines 211 and 212 are disposed in the sensor area 330 and the wiring connection area 340 and are not disposed in the display area 310. In addition, at least a part of the auxiliary scan lines 211 and 212 overlap the scan lines 151 and 153, respectively, in the sensor area 330 in a plan view. The auxiliary scan lines 211 and 212 respectively include bent portions 213 and 214 in the wiring connection area 340 and are connected to the scan lines 152 and 154 through the respective contact holes 215 and 216 formed in the first insulating interlayer 160 and the third insulating interlayer 200.

Next, according to an exemplary embodiment, a second insulating interlayer 180 is disposed on the auxiliary scan lines 211 and 212. In addition, as in the display area 310, data lines 191 and 193 and high potential lines 192 and 194 are disposed on the second insulating interlayer 180. A planarization layer 220 and a sealing member 270 are disposed on the data lines 191 and 193 and the high potential lines 192 and 194.

According to an exemplary embodiment, the third insulating interlayer 200 includes a material substantially the same as a material included in the second insulating interlayer 180. The auxiliary scan lines 211 and 212 include a material substantially the same as a material included in the scan line SL or the data line DL.

In an exemplary embodiment, a pixel electrode PE, a light blocking layer 240, a light emitting layer 250, a common electrode 260, etc., are not formed in the sensor area 330 or are removed therefrom. For example, the light emitting layer 250 and the common electrode 260 can be formed with the display area 310 and then removed using a laser energy source. In addition, the common electrode 260 can be deposited through a metal self patterning method such that the common electrode 260 is formed in the display area 310 but not in the sensor area 330. Such a structure is not limited to an exemplary embodiment and can be part of all exemplary embodiments described below.

In addition, according to an exemplary embodiment, at least one of insulating layers such as the buffer layer 120, the gate insulating layer 140, the first, second and third insulating interlayers 160, 180 and 200 or the planarization layer 220 is not formed in or is removed from an area that does not overlap the above-described lines 151, 153, 211, 212, 191 and 194 in the sensor area 330. For example, after the light emitting layer 220 and the common electrode 260 are removed as described above, the gate insulating layer 140, the first, second and third insulating interlayers 160, 180 and 200 and the planarization layer 220 are removed. Thereafter, a sealing member 270 is disposed. No insulating layer is disposed on the area that does not overlap any of the above-described lines 151, 153, 211, 212, 191 and 194 in the sensor area 330. However, to ensure insulation of the above-described lines 151, 153, 211, 212, 191, 192, 193 and 194, an insulating layer remains in an area adjacent to the above-described lines without being removed. The insulating layer removal structure is not only limited to an exemplary embodiment, but may part of all exemplary embodiments described below.

Hereinafter, an exemplary embodiment of the present disclosure will be described more specifically with reference to FIGS. 7 and 9. Herein, descriptions of components described hereinabove with respect to FIGS. 7 and 8 will be omitted.

According to an exemplary embodiment, a substrate 110, a buffer layer 120, a gate insulating layer 140, scan lines 151, 152, 153 and 154, a first insulating interlayer 160 and an initialization line 172 are disposed as shown in FIG. 8.

According to an exemplary embodiment, a second insulating interlayer 180 is disposed on the initialization line 172. In addition, data lines 191 and 193 and high potential lines 192 and 194 are disposed on the second insulating interlayer 180.

According to an exemplary embodiment, a third insulating interlayer 200 is disposed on the data lines 191 and 193 and the high potential lines 192 and 194. Contact holes 215 and 216 are formed in the first insulating interlayer 160, the second insulating interlayer 180, and the third insulating interlayer 200 to expose the scan lines 152 and 154 at the wiring connection area 340.

In addition, according to an exemplary embodiment, auxiliary scan lines 211 and 212 are disposed on the third insulating interlayer 200. At least a part of the auxiliary scan lines 211 and 212 overlap the scan lines 151 and 153, respectively, in the sensor area 330 in a plan view. The auxiliary scan lines 211 and 212 respectively include bent portions 213 and 214 in the wiring connection area 340 and are connected to the scan lines 152 and 154 through the respective contact holes 215 and 215 formed in the first insulating interlayer 160, the second insulating interlayer 180 and the third insulating interlayer 200.

Next, according to an exemplary embodiment, a planarization layer 220 and a sealing member 270 are disposed on the auxiliary scan lines 211 and 212.

Hereinafter, an exemplary embodiment of the present disclosure will be described more specifically with reference to FIGS. 7 and 10. Herein, descriptions of components described hereinabove with respect to FIGS. 8 and 9 will be omitted.

According to an exemplary embodiment, a substrate 110, a buffer layer 120, a gate insulating layer 140, scan lines 151, 152, 153 and 154, a first insulating interlayer 160 and an initialization line 172 are disposed as shown in FIG. 9.

According to an exemplary embodiment, a second insulating interlayer 180 is disposed on the initialization line 172. In addition, data lines 191 and 193 and high potential lines 192 and 194 are disposed on the second insulating interlayer 180. In addition, a planarization layer 220 is disposed on the data lines 191 and 193 and high potential lines 192 and 194.

According to an exemplary embodiment, contact holes 215 and 216 are formed in the first insulating interlayer 160, the second insulating interlayer 180, and the planarization layer 220 to expose the scan lines 152 and 154 in the wiring connection area 340. Auxiliary scan lines 211 and 212 are disposed on the planarization layer 220 in the sensor area 330 and the wiring connection area 340. At least a part of the auxiliary scan lines 211 and 212 overlap the scan lines 151 and 153, respectively, in the sensor area 330 in a plan view. The auxiliary scan lines 211 and 212 respectively include bent portions 213 and 214 in the wiring connection area 340 and are connected to the scan lines 152 and 154 through the respective contact holes 215 and 216 formed in the first insulating interlayer 160, the second insulating interlayer 180, and the planarization layer 220.

Next, according to an exemplary embodiment, a sealing member 270 is disposed on the auxiliary scan lines 211 and 212. The auxiliary scan lines 211 and 212 and a pixel electrode PE are formed substantially simultaneously using substantially a same material.

In the above-described exemplary embodiments, the scan lines 151 and 153 extend from the display area 310 into the sensor area 330 in the X-axis direction in substantially a same layer, and the auxiliary scan lines 211 and 212 overlap the scan lines 151 and 153 in the sensor area 330, but exemplary embodiments are not limited thereto. For example, the scan lines 151 and 154 may extend from the display area 310 into the sensor area 330 in the X-axis direction on a substantially same layer and the auxiliary scan lines 211 and 212 may overlap the scan lines 151 and 154 in the sensor area 330.

In addition, according to an exemplary embodiment, although FIG. 7 shows that the widths of the scan lines 151 and 153 differs from the widths of the auxiliary scan lines 211 and 212, the widths of the scan lines 151 and 153 and the auxiliary scan lines 211 and 212 may be substantially equal to each other. In addition, the scan lines 151 and 153 and the auxiliary scan lines 211 and 212 may partially overlap each other in the width direction.

According to exemplary embodiments, as an area occupied by the scan lines 151 and 153 and the auxiliary scan lines 211 and 212 in the sensor area 330 in a plan view is reduced by about ½ and an interval between the scan lines 151 and 153 and the auxiliary scan lines 211 and 212 increases, signal transmittance in the sensor area 330 can be increased.

In addition, according to exemplary embodiments, although the scan line 151 and the auxiliary scan line 211 overlap each other in the sensor area 330, exemplary embodiments are not limited thereto. For example, three or more lines may overlap each other on different layers in substantially the same manner as in above exemplary embodiments.

In exemplary embodiments, although the scan lines 151 and 153 and the auxiliary scan lines 211 and 212 overlap each other at the sensor area 330, exemplary embodiments are not limited thereto. For example, the data lines 191 and 193 and power lines 192 and 194 may overlap each other in the sensor area in the same manner as in above-described exemplary embodiments.

Hereinafter, an exemplary embodiment of the present disclosure will be described more specifically with reference to FIGS. 7 and 11. Herein, detailed descriptions of the components of the display area described above with respect to FIGS. 8-10 will be omitted.

Figure 11:
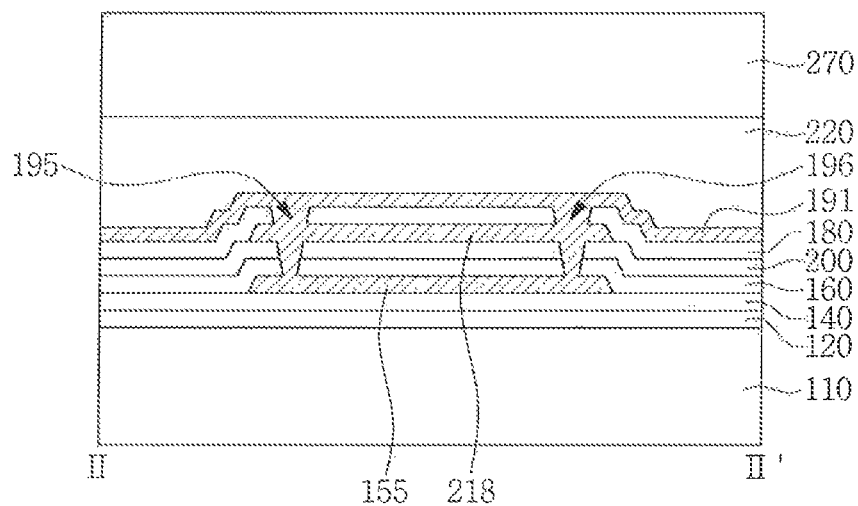
FIG. 11 is a cross-sectional view taken along line II-II' of FIG. 7.

FIG. 11 is a cross-sectional view taken along line II-II' of FIG. 7. For ease of description, a floating data line DL and high potential line VDL is described based on a stack structure of FIG. 8. However, exemplary embodiments are not limited thereto and the floating line may be described based on the stack structures of FIG. 9 or 10 or other exemplary embodiments described hereinbelow.

According to exemplary embodiments, data lines 191 and 193 and high potential lines 192 and 194 are disposed on a second insulating interlayer 180 as depicted in FIG. 11 and described with respect to FIG. 8. A planarization layer 220 and a sealing member 270 are disposed on the data lines 191 and 193 and the high potential lines 192 and 194.

In addition, according to exemplary embodiments, a first floating line 155 is disposed between a gate insulating layer 140 and a first insulating interlayer 160 and a second floating line 218 is disposed between a third insulating interlayer 200 and the second insulating interlayer 180. In addition, a third floating line may be disposed between the first insulating interlayer 160 and the third insulating interlayer 200. The data line 191, the first floating line 155 and the second floating line 218 are connected to each other through contact holes 195 and 196 formed in the first insulating interlayer 160, the third insulating interlayer 200 and the second insulating interlayer 180. The first floating line 155, the second floating line 218 and the third floating line overlap the data line 191 in a plan view. Each of the first floating line 155, the second floating line 218 and the third floating line have a width substantially equal to a width of the data line 191 and are not long enough to contact the scan lines 151 and 153, the auxiliary scan lines 211 and 212 and an initialization line 172.

According to exemplary embodiments, the first floating line 155 and the scan lines SL on the gate insulating layer 140 are formed substantially simultaneously using substantially a same material, the second floating line 218 and the auxiliary scan lines 211 and 212 on the third insulating interlayer 200 are formed substantially simultaneously using a substantially same material, and the third floating line and the initialization lines IL on the first insulating interlayer 160 are formed substantially simultaneously using substantially a same material.

According to exemplary embodiments, the floating lines 155 and 218 formed to reduce a resistance of the data line 191. Hereinabove, although an embodiment illustrated in FIG. 11 shows, for example, the floating lines 155 and 218 overlapping the data line 191, exemplary embodiments are not limited thereto. Exemplary embodiments may include a power line such as the high potential lines 192 and 194, the scan lines 151, 152, 153 and 154 and the auxiliary scan lines 211 and 212.

Figure 12:
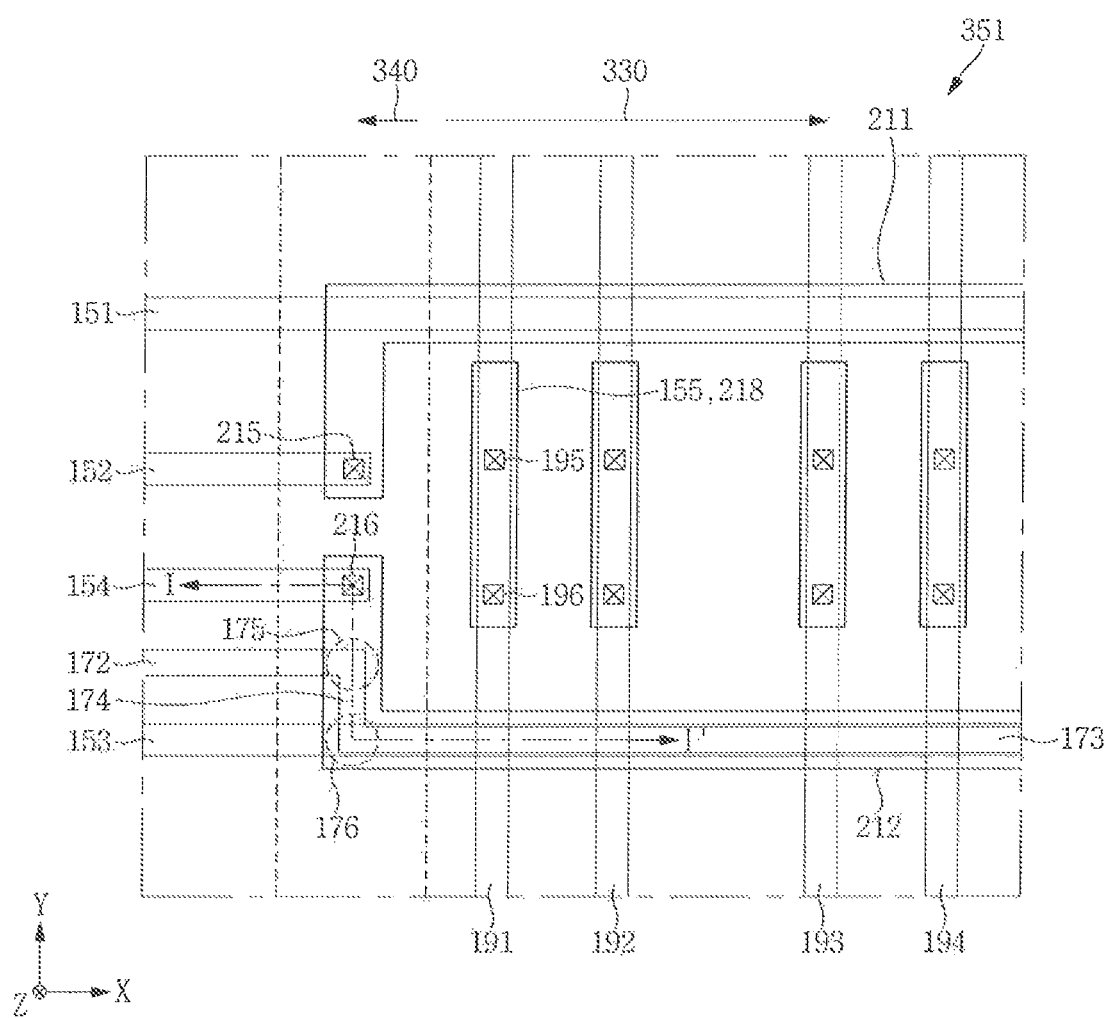
FIG. 12 is an enlarged view of an area where a wiring connection area meets a sensor area in the X-axis direction, according to an exemplary embodiment.
Figure 13:
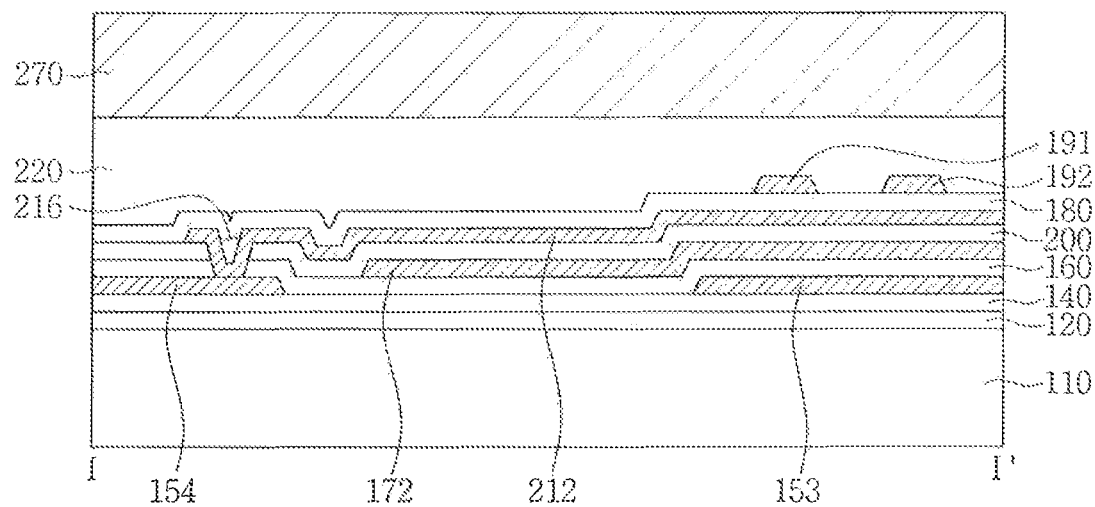
FIG. 13 is a cross-sectional view taken along line I-I' of FIG. 12, according to an exemplary embodiment.

FIG. 12 is an enlarged view of an area 351 of FIG. 6 where a wiring connection area meets the sensor area in the X-axis direction according to an exemplary embodiment and FIG. 13 is a cross-sectional view taken along line I-I' of FIG. 12.

Hereinafter, an exemplary embodiment of the present disclosure will be described more specifically with reference to FIGS. 12 and 13. Herein, detailed descriptions of components of a display area described hereinabove will be omitted.

As illustrated in FIGS. 12 and 13, an exemplary embodiment the present disclosure is directed to a rerouting of an initialization line IL that is disposed on a different layer from that on which scan lines 151, 152, 153 and 154 and auxiliary scan lines 211 and 212 are disposed. Hereinafter, for ease of description, descriptions will be given based on an exemplary embodiment shown in FIG. 8.

According to exemplary embodiments, as described hereinabove for FIG. 8, a buffer layer 120, a gate insulating layer 140, the scan lines 151, 152, 153 and 154, the auxiliary scan lines 211 and 212, initialization lines 172 and 173, data lines 191 and 193 and high potential lines 192 and 193 are disposed on a substrate 110. The auxiliary scan lines 211 and 212 overlap the scan lines 151 and 153, respectively, in a sensor area 330 in a plan view.

According to exemplary embodiments, the initialization lines 172 and 173 are disposed between the first insulation layer 160 and the third insulation layer 200 in areas 310, 330 and 340. That is, the initialization lines 172 and 173 are disposed in a same layer that is a different layer from that on which the scan lines 151, 152, 153 and 154 and the auxiliary scan lines 211 and 212 are disposed.

According to exemplary embodiments, in the display area 310, the initialization line 172 is disposed between the scan lines 151, 152, 153 and 154 and thus do not overlap the scan lines 151, 152, 153 and 154 in a plan view. In the sensor area 330, the initialization line 173 overlaps the scan lines 153 and 212. In the wiring connection area 340, the initialization line 174 includes bent portions 175 and 176 that connect the initialization line 172 to the initialization line 173.

According to an exemplary embodiment, as the initialization line 173 overlaps the scan lines in the sensor area 330, an area of the sensor area 330 can be reduced. Accordingly, an interval between the lines in the sensor area 330 can be increased.

Although an exemplary embodiment has been described as compared to an exemplary embodiment shown in FIG. 8, similar features can be incorporated into exemplary embodiments shown in FIGS. 9-10. In addition, in an exemplary embodiment, the initialization lines overlap any one of the scan lines 151, 152 and 154 instead of overlapping scan lines 153 and 212. Although an exemplary embodiment has been described with respect to the initialization line IL by way of example, exemplary embodiments are not limited thereto, and other lines may be rerouted to overlap the scan lines.

Figure 14:
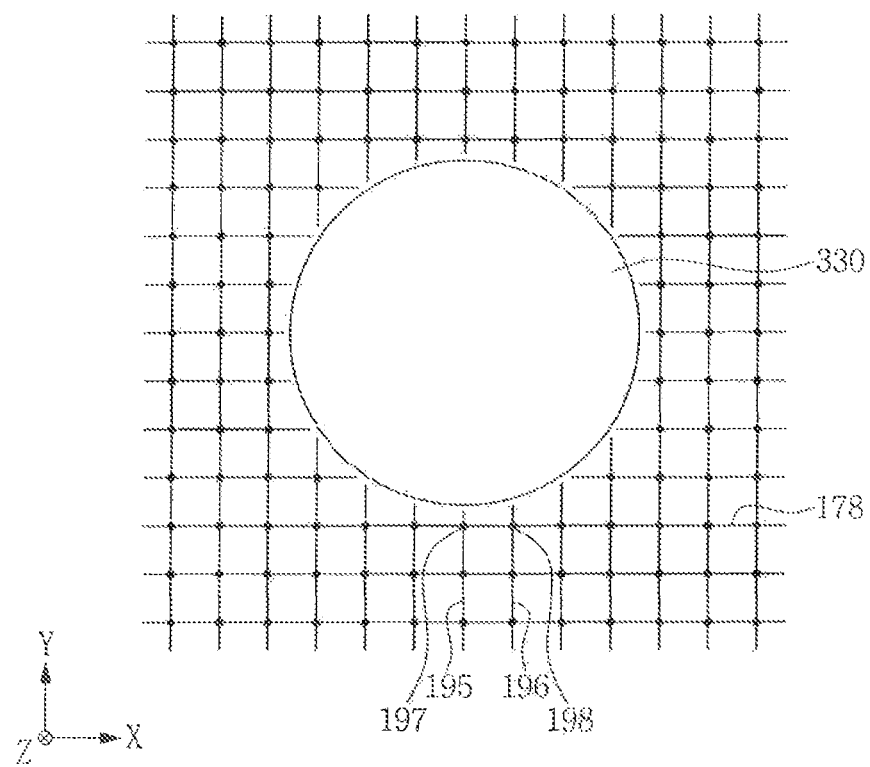
FIG. 14 is a wiring diagram of a high potential line around a sensor area, according to an exemplary embodiment.

FIG. 14 is a wiring diagram of a high potential line VDL around sensor area 330 according to an exemplary embodiment. Although FIG. 14 depicts a high potential line VDL by way of example, exemplary embodiments are not limited thereto. For example, exemplary embodiments may incorporate other kinds of power lines, e.g., a low potential line VSL and an initialization line IL. In addition, exemplary embodiments may incorporate not only a non-penetrating sensor area but also a penetrating sensor area.

According to exemplary embodiments, as illustrated in FIG. 14, the high potential line VDL includes a plurality of lines 195 and 196, hereinafter referred to as "main power lines", in a first direction, such as the Y-axis direction, and a plurality of lines 178, hereinafter referred to as "auxiliary power lines", in a second direction, such as the X-axis direction, which crosses the first direction. The main power lines 195 and 196 and the auxiliary power line 178 are connected to each other at crossing points 197 and 198 to form a mesh. In addition, the high potential lines VDL, i.e., the main power lines 195 and 196 and the auxiliary power line 178, are not disposed in the sensor area 330.

According to exemplary embodiments, the main power lines 195 and 196 and the auxiliary power line 178 are disposed in substantially a same layer. The main power lines 195 and 196 and the auxiliary power line 178 are disposed in a different layer from that on which the scan line SL and the data line DL are disposed. In addition, the main power lines 195 and 196 and the auxiliary power line 178 are formed on the third insulating interlayer 200. Since auxiliary scan lines 211 and 212 are disposed in the sensor area 330 but not in the display area 310, the auxiliary scan lines 211 and 212 and the high potential lines, i.e. the main power lines 195 and 196 and the auxiliary power line 178, do not contact each other and are formed substantially simultaneously on the third insulating interlayer 200.

Alternatively, according to exemplary embodiments, the main power lines 195 and 196 are disposed on a different layer from that on which the auxiliary power line 178 is disposed, as described below in which the main power lines 195 and 196 and the auxiliary power line 178 are connected to each other through contact holes formed at the crossing points 197 and 198.

Figure 15:
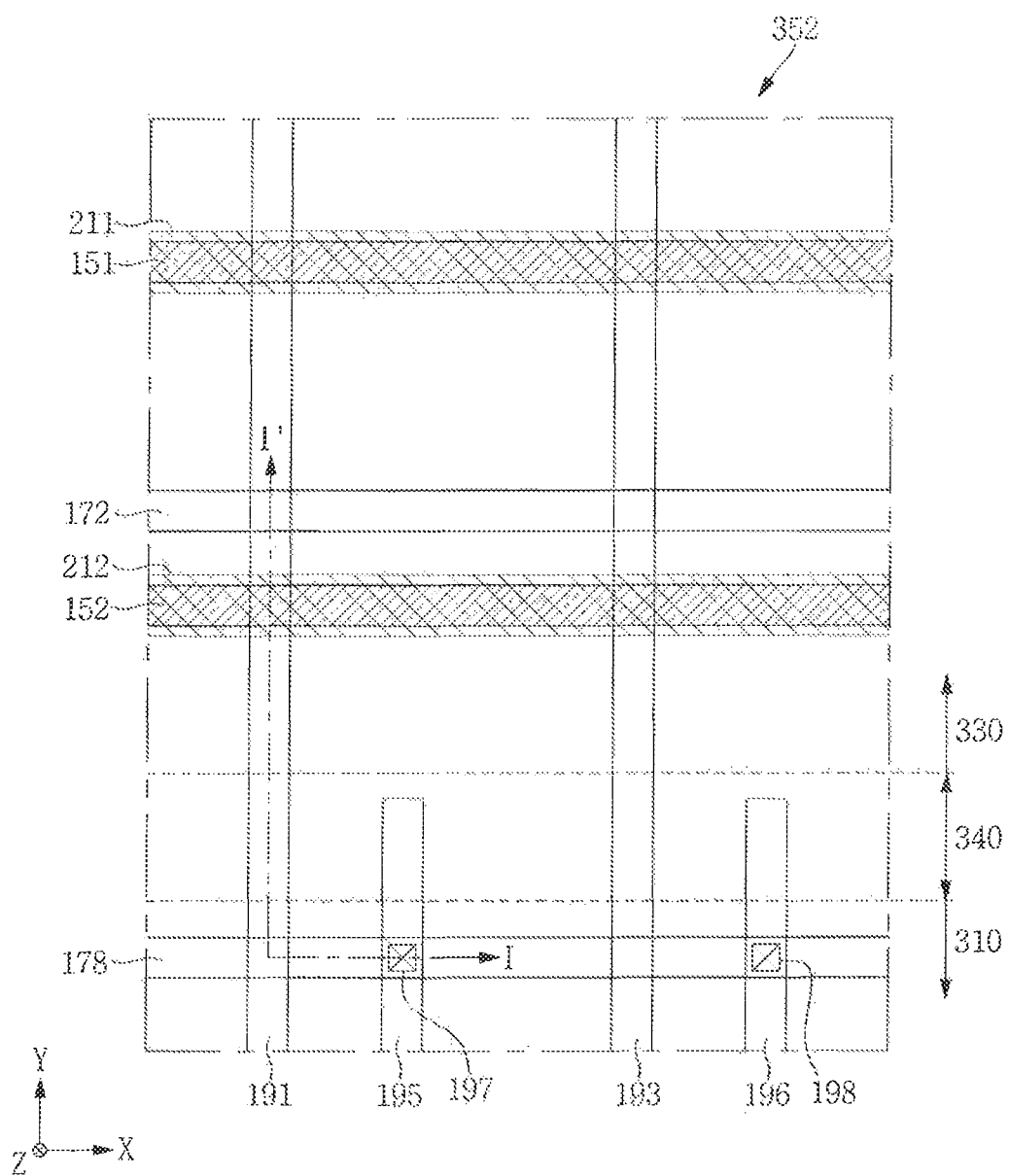
FIG. 15 is an enlarged view of an area where a sensor area meets a display area in a Y-axis direction, according to an exemplary embodiment.
Figure 16:
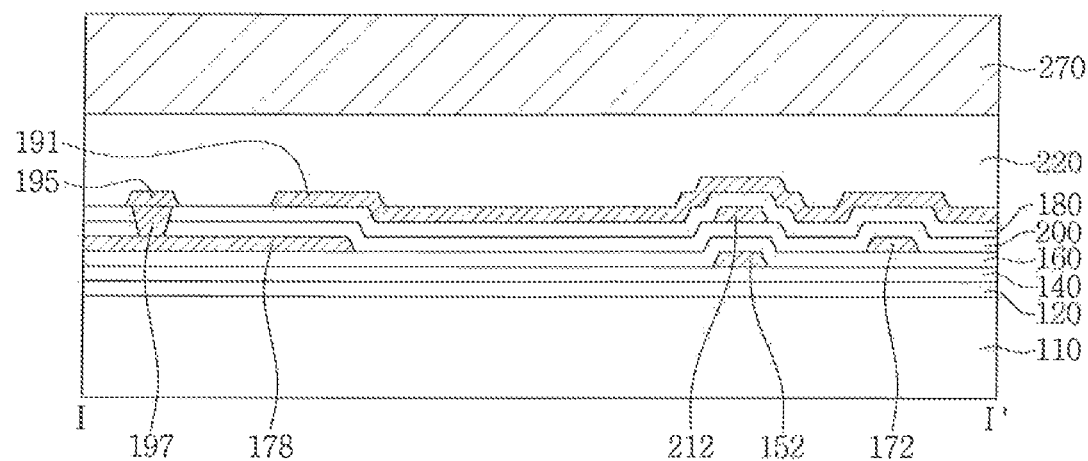
FIG. 16 is a cross-sectional view taken along line I-I' of FIG. 15.

FIG. 15 is an enlarged view of an area 352 in FIG. 6 at which a sensor area meets a display area in a Y-axis direction, according to an exemplary embodiment and FIG. 16 is a cross-sectional view taken along the line I-I' of FIG. 15. Herein, detailed descriptions of components of a display area described hereinabove will be omitted. Although an exemplary embodiment is described FIG. 7 for ease of description, exemplary embodiments are not limited thereto. Exemplary embodiments may incorporate a structure shown in FIG. 9, or may structures other than those shown in FIGS. 8-9.

According to exemplary embodiments, as illustrated in FIGS. 14 and 15, high potential lines 195, 196 and 178 are not disposed in a sensor area 330. That is, main power lines 195 and 196 extend from a display area 310 in a Y-direction extend only into a wiring connection area 340, or do not extend past the display area 310). In addition, auxiliary power lines extend from the display area 310 in a X-direction extend into the wiring connection area 340, and do not extend into the sensor area 330.

Referring to FIGS. 15 and 16, according to exemplary embodiments, a buffer layer 120 and a gate insulating layer 140 are disposed on substrate 110, as shown in FIG. 8. A first insulating interlayer 160 is disposed on the scan lines 151, 152, 153 and 154 and an initialization line (IL) 172 is disposed on the first insulating interlayer 160.

In addition, according to exemplary embodiments, an auxiliary power line 178 is formed along with the initialization line 172. That is, the auxiliary power line 178 is disposed between the initialization lines 172 on substantially a same layer as the initialization line 172. As described above, the auxiliary power line 178 is not disposed in the sensor area 330. A third insulating interlayer 200 is disposed on the initialization line 172 and the auxiliary power line 178, and auxiliary scan lines 211 and 212 are disposed on the third insulating interlayer 200.

Next, according to exemplary embodiments, a second insulating interlayer 180 is disposed on the auxiliary scan lines 211 and 212. A contact hole 197 is formed in the third insulating interlayer 200 and the second insulating interlayer 180 to expose the auxiliary power line 178 therethrough.

Next, according to exemplary embodiments, data lines 191 and 193 and the main power lines 195 and 196 are disposed on the second insulating interlayer 180. That is, the main power lines 195 and 196 are disposed between the data lines 191 and 193 on substantially a same layer as the layer on which the data lines 191 and 193 are disposed. In addition, as described above, the main power lines 195 and 196 are not disposed in the sensor area 330. The main power lines 195 and 196 are connected to the auxiliary power line 178 through the contact holes 197 and 198 formed in the third insulating interlayer 200 and the second insulating interlayer 180. A planarization layer 220 and a sealing member 270 are disposed on the data lines 191 and 193 and the main power lines 195 and 196.

Hereinabove, according to exemplary embodiments, although the main power lines 195 and 196 are described as being disposed on substantially a same layer as the data lines 191 and 193, and the auxiliary power line 178 is disposed on substantially a same layer as the initialization line 172, exemplary embodiments are not limited thereto. For example, the main power lines 196 and 196 may be disposed on a layer on which Y-axis direction lines are disposed and the auxiliary power line 178 may be disposed on a layer on which X-axis direction lines are disposed.

Figure 17:
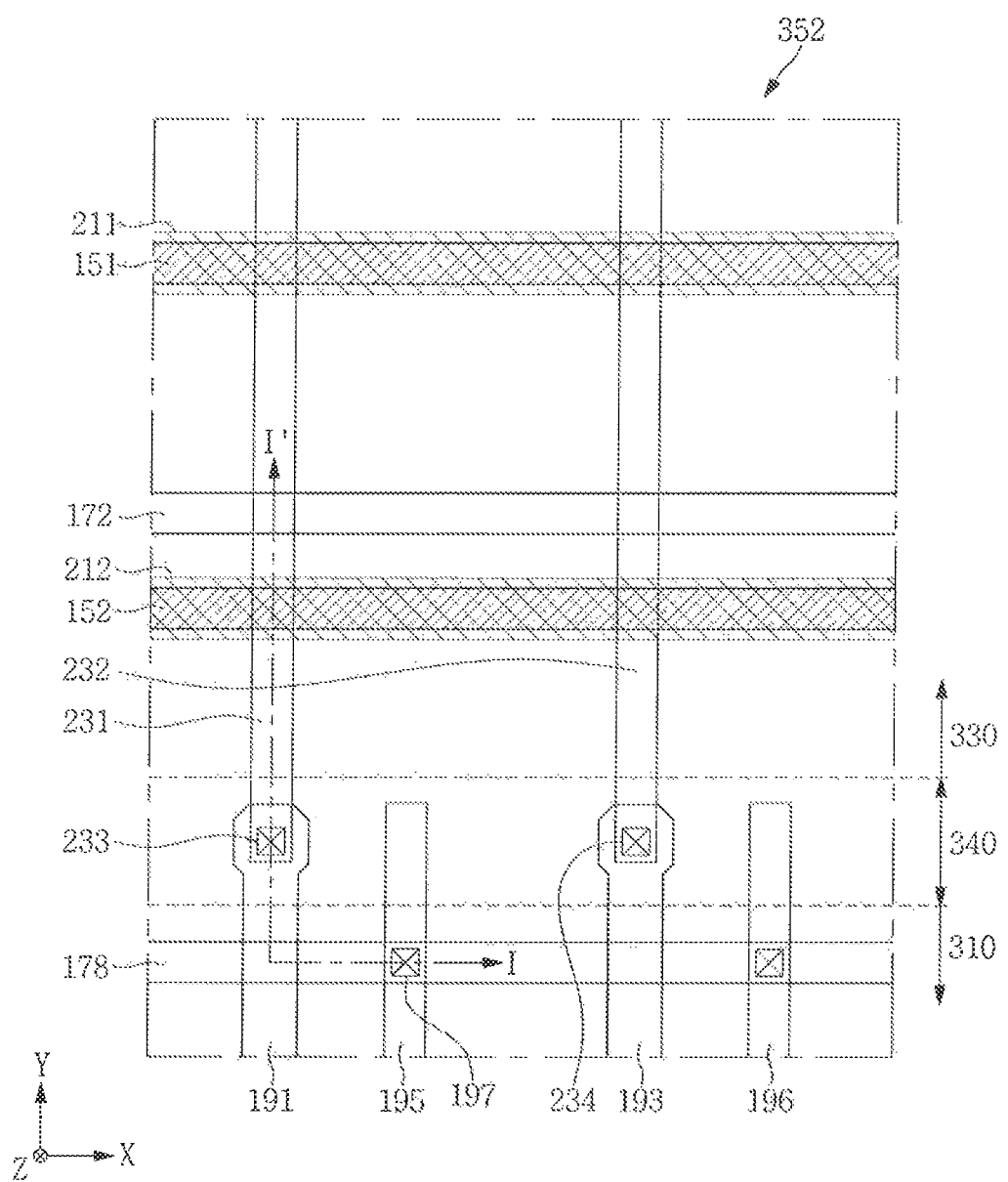
FIG. 17 is an enlarged view of an area where a sensor area meets a display area in a Y-axis direction according to an exemplary embodiment.
Figure 18:
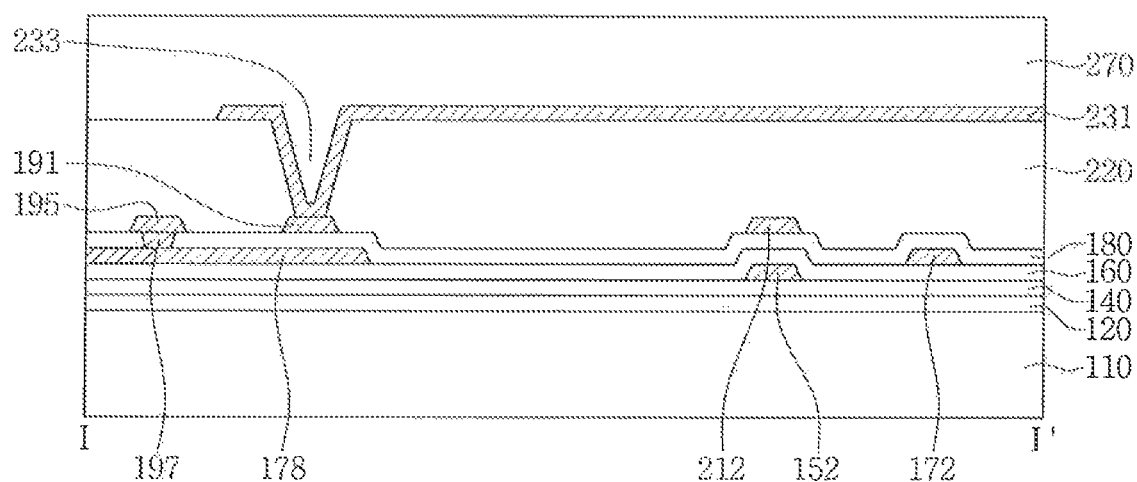
FIG. 18 is a cross-sectional view taken along line I-I' of FIG. 17.

FIG. 17 is an enlarged view of an area a352 of FIG. 6 where a sensor area meets a display area in a Y-axis direction, according to an exemplary embodiment and FIG. 18 is a cross-sectional view taken along the line I-I' of FIG. 17. Hereinafter, an exemplary embodiment will be described with reference to FIGS. 14, 17 and 18. Herein, detailed descriptions of components of the display area described hereinabove will be omitted. As described hereinabove with respect to FIGS. 15-16, high potential lines 195, 196 and 178 are not disposed at the sensor area 330.

Referring to FIGS. 17 and 18, according to exemplary embodiments, a buffer layer 120 and a gate insulating layer 140 are disposed on substrate 110, as shown in FIG. 16. A first insulating interlayer 160 is disposed on the scan lines 151, 152, 153 and 154, and an initialization line (IL) 172 is disposed on the first insulating interlayer 160. In addition, an auxiliary power line 178 is formed along with the initialization line 172.

According to exemplary embodiments, a second insulating interlayer 180 is disposed on the initialization line 172 and the auxiliary power line 178, and auxiliary scan lines 211 and 212 are disposed on the second insulating interlayer 180. In addition, data lines 191 and 193 and main power lines 195 and 196 are disposed on the second insulating interlayer 180, but the data lines 191 and 193 and the main power lines 195 and 196 are not disposed in the sensor area 330. That is, the main power lines 195 and 196 extend from the display area 310 in a Y-direction extend only into a wiring connection area 340.

In addition, according to exemplary embodiments, the main power lines 195 and 196 are connected to an auxiliary power line 178 through a contact hole 197 formed in the second insulating interlayer 180. A planarization layer 220 is disposed on the data lines 191 and 193 and the main power lines 195 and 196 and contact holes 233 and 234 are formed in the planarization layer 220 to expose the data lines 191 and 193 in the wiring connection area 340.

According to exemplary embodiments, the data lines 231 and 232 are disposed on the planarization layer 220 in the sensor area 330 and the wiring connection area 340. The data lines 231 and 232 and the pixel electrode PE are formed substantially simultaneously using substantially a same material. Opposite end portions of the data lines 231 and 232 are disposed, one at one wiring connection area 340 and the other at an opposite wiring connection area 340. Data lines 231 and 232 are connected to data lines 191 and 192 through contact holes 233 and 234 formed in the planarization layer 220. A sealing member 270 is disposed on data lines 231 and 232.

Figure 19:
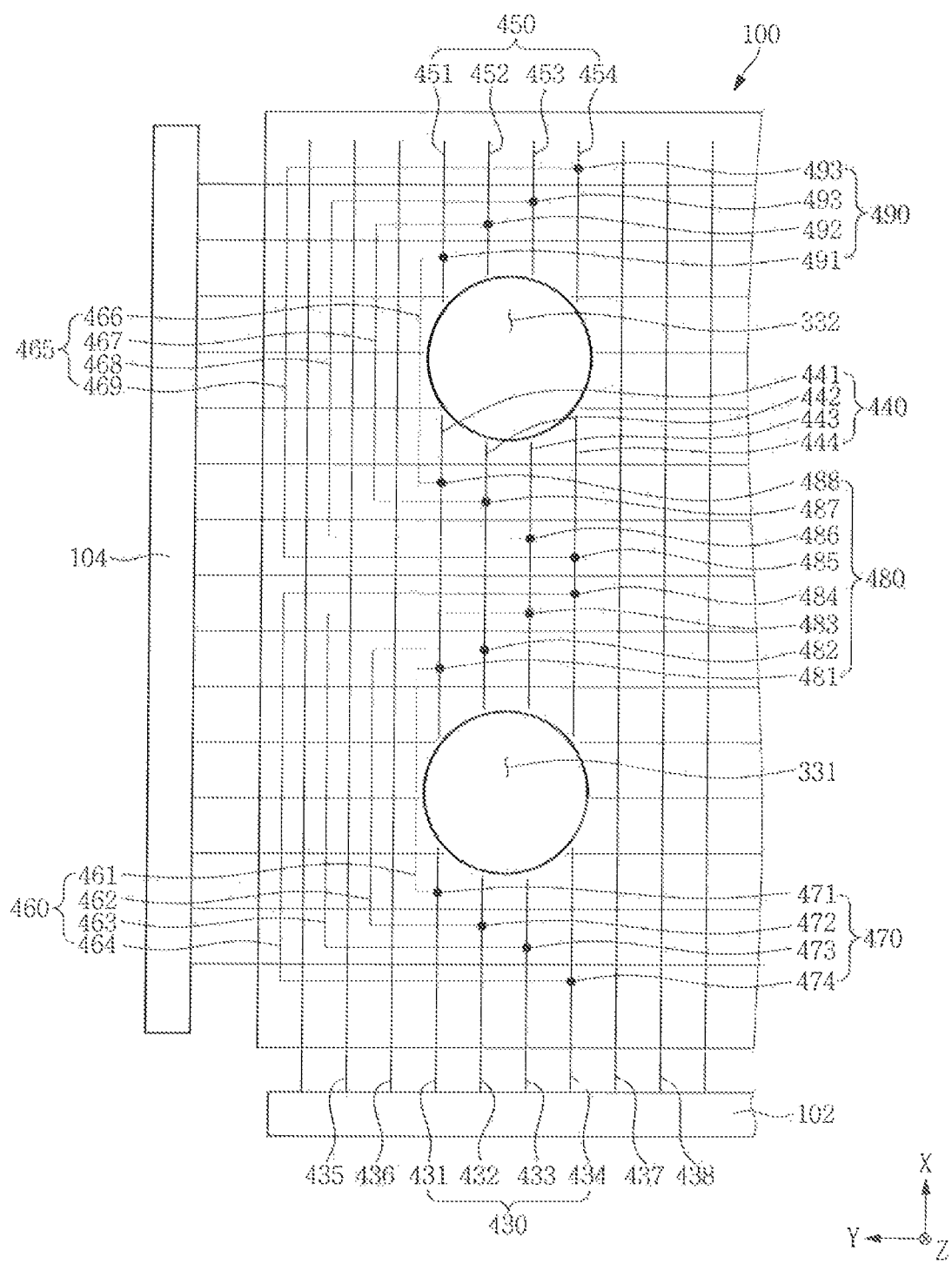
FIGS. 19 and 20 are wiring diagrams of display devices according to exemplary embodiments.
Figure 20:
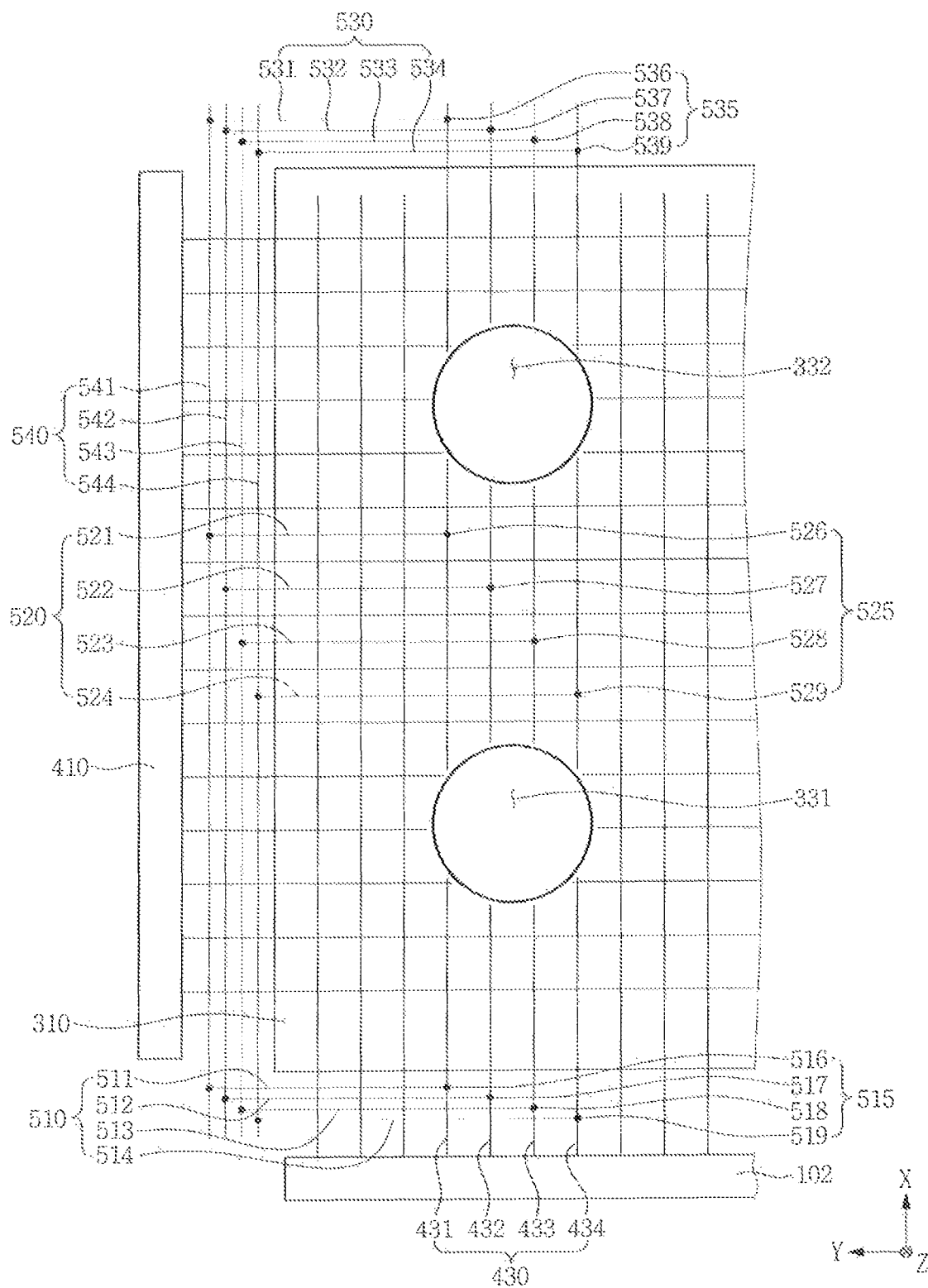

FIGS. 19 and 20 are wiring diagrams of display devices according to exemplary embodiments. Hereinafter, a bypass line that bypasses a sensor area will be described in detail with reference to FIGS. 19 and 20.

According to exemplary embodiments, FIGS. 19 and 20 illustrate an upper end portion of the display device 100 that includes a plurality of sensor areas of FIG. 6. In the following description, horizontal, vertical, left, right, upper and lower directions are based on a display device of FIG. 6. As described hereinabove with reference to FIG. 1, a display device 100 according to an exemplary embodiment includes a display panel 101, a scan driver 102 and a data driver 103.

As described above according to exemplary embodiments, the display panel 101 includes a plurality of sensor areas 331, 332 and 333 in a display area 310. Accordingly, as illustrated in FIG. 19, scan lines that extend in a X-direction and that cross the plurality of sensor areas 331 and 332 are divided into three groups of lines by the plurality of sensor areas 3331 and 332. That is, scan lines that extend in a X-direction and that cross the sensor areas 331 and 332 include first line group 430 that includes lines 431, 432, 433 and 434 that have one end directly connected to the scan driver 102 and another end cut by the sensor area 331, second line group 440 that includes lines 441, 442, 443 and 444 with opposite ends respectively cut by the sensor areas 331 and 332, and third line 450 that includes line 451, 452, 453 and 454 that have one end cut by the sensor area 332 and another end that extends toward the opposite side of the scan driver 102. On the other hand, the other scan lines 435, 436, 437 and 438 are not separated by the sensor area 330.

Referring to FIG. 19, according to exemplary embodiments, bypass line group includes lines 461, 462, 463 and 464 that connect lines 431, 432, 433 and 434 of the first line group 430 and lines 441, 442, 443 and 444 of the second line group 440, respectively, and bypass line group 465 includes lines 466, 467, 468 and 469 that connect lines 441, 442, 443 and 444 of the second line group 440 and lines 451, 452, 453 and 454 of the third line group 450, respectively. Bypass lines 461, 462, 463 and 464 are spaced apart from the scan lines 431, 432, 433, 434, 435, 436, 437 and 438 with an insulating layer, such as a third insulating interlayer 200, therebetween. Bypass lines 461, 462, 463 and 464 are connected to the lines 431, 432, 433 and 434, respectively, through contact hole group 470 that includes contact holes 471, 472, 473 and 474 formed in the insulating layer, and are connected to the lines 441, 442, 443 and 444, respectively, through contact holes 481, 482, 483 and 484 of contact hole group 480 formed in the insulating layer. Accordingly, the lines 431, 432, 433 and 434 of the first line group 430 are connected to the lines 441, 442, 443 and 444 or the second line group 440, respectively, through bypass lines 461, 462, 463 and 464, such that a scan signal is transmitted to the lines 441, 442, 443 and 444.

Similarly, according to exemplary embodiments, other bypass lines 466, 467, 468 and 469 of bypass line group 465 connect the lines 441, 442, 443 and 444 of the second line group 440 and the lines 451, 452, 453 and 454 of the third line group 450, respectively. Accordingly, the lines 441, 442, 443 and 444 are connected to the lines 451, 452, 453 and 454 through the bypass lines 466, 467, 468 and 469 of bypass line group 465, respectively, such that a scan signal is transmitted to the lines 451, 452, 453 and 454.

For example, according to exemplary embodiments, the bypass lines 461, 462, 463 and 464 extend in the Y-axis direction in the display area 310 from the contact holes of contact hole group 470 in the display area 310 on a left side of the sensor area 331, extend in the X-axis direction in the display area 310 to an upper side of the sensor area 331, and extend in the Y-axis direction to contact holes 481, 482, 483 and 484 of contact hole group 480 located in the display area 310 on a right side of the sensor area 331.

Similarly, according to exemplary embodiments, other bypass lines 466, 467, 468 and 469 of bypass line group 465 extend in the Y-axis direction in the display area 310 from contact holes 485, 486, 487 and 488 of contact hole group 480 located in the display area 310 on a left side of a sensor area 332, extend in the X-axis direction in the display area 310 to an upper side of the sensor area 332, and extend in the Y-axis direction to contact holes 491, 492, 493 and 494 of contact hole group 490 located in the display area 310 on a right side of the sensor area 312.

Although bypass line groups 460 and 465 are described as extending in the X-axis direction and the Y-axis directions in the display area 310, exemplary embodiments are not limited thereto. The contact holes 470 and 490 may be located in the non-display area 320 at an edge of the display area 310 and the bypass lines 460 and 465 may extend along the non-display area 320 in the X-axis direction or the Y-axis directions. However, the contact holes of contact hole group 480 for connecting lines of second line group 440 between the plurality of sensor areas 331 and 332 are located at the display area 310.

In addition, although the bypass line groups 460 and 465 are described as extending in the X-axis direction and the Y-axis directions, exemplary embodiments are not limited thereto. For example, the bypass lines 460 and 465 have an oblique straight shape or a curved line shape. In addition, the bypass lines 460 and 465 may be curved in a shape similar to that of the sensor areas 330.

In addition, although the lines 431, 432, 433 and 434 of first line group 430 and the lines of second line group 440 are connected to each other by the line of bypass line group 460, and the lines of the second line group 440 and the lines of the third line group 450 are connected to each other by lines of bypass line group 465, exemplary embodiments are not limited thereto. For example, the lines of the first line group 430 and the second line group 440 may be connected to each other by the lines of bypass line group 460 and the lines 431, 432, 433 and 434 of first line group 430 and the lines of the third line group 450 may be connected to each other by other bypass lines.

In an exemplary embodiment, lines of the bypass line groups 460 and 465 are disposed between the third insulating interlayer 200 and the second insulating interlayer 180 as shown in FIG. 8, and the lines of bypass line groups 460 and 465 and each of the line groups 430, 440 and 450 are connected to each other through the holes of contact hole groups 470, 480 and 490 formed in the first insulating interlayer 160 and the third insulating interlayer 200.

FIG. 20 is a bypass line diagram according to an exemplary embodiment.

Referring to FIG. 20, bypass lines include bypass line group 540 with bypass lines 541, 542, 543, and 544 that extend in the X-axis direction parallel to scan lines SL and bypass line group 510 with bypass lines 511, 512, 523, and

514, bypass line group 520 with bypass lines 521, 522, 523, and 524, and bypass group 530 with bypass lines 531, 532, 533, and 534, all of which extend in the Y-axis direction. The bypass lines of bypass group 540 extending in the X-axis direction are formed on a pattern layer on which lines in the X-axis direction, such as scan lines SLn and EL and initialization line IL, are formed. The bypass lines of bypass lines groups 510, 520 and 530 extending in the Y-axis direction are formed on a pattern layer on which lines in the Y-axis direction, such as data lines DL, are formed. Accordingly, the bypass lines of bypass line group 540 extending in the X-axis direction and the bypass lines of bypass line groups 510, 520 and 530 extending in the Y-axis direction are spaced apart from each other with a first insulating interlayer and a second insulating interlayer, and in some embodiments, a third insulating interlayer, therebetween, and are connected to each other through contact holes formed in the insulating layers.

More specifically, according to exemplary embodiments, the bypass lines of bypass line group 540 extending in the X-axis direction extend along a non-display area 320. The bypass lines of bypass line group 510 extending in the Y-axis direction have one end connected to lines 431, 432, 433 and 434 of line group 430, through contact holes 516, 517, 518 and 519, respectively, of contact hole group 515 located in the non-display area 320 and another end connected to the bypass lines of bypass line group 540 extending in the X-axis direction through contact holes located at the non-display area 320. The bypass lines of bypass line group 520 extending in the Y-axis direction have one end connected to lines of the second line group 440 through a contact holes 526, 527, 528 and 529 of bypass line group 525 located in the display area 310 and another end connected to the bypass lines of bypass line group 540 extending in the X-axis direction through contact holes located in the non-display area 320. The bypass lines of bypass line group 530 extending in the Y-axis direction have one end connected to lines of third line group 450 through contact holes 536, 537, 538 and 539 of contact hole group 535 located in the non-display area 320 and another end connected to the bypass lines of bypass line group 540 extending in the X-axis direction through contact holes located at the non-display area 320. Accordingly, the bypass lines of bypass line groups 515 and 535 extending in the Y-axis direction extend along the non-display area 320 and the bypass lines of bypass line group 520 extending in the Y-axis direction are disposed in the non-display area 320 and the display area 310.

Accordingly, in exemplary embodiments, the lines 431, 432, 433 and 434 of the first line group 430, the lines of the second line group 440 and the lines of the third line group 450 are connected to each other through lines of the bypass line groups 510, 520 and 530 extending in the Y-axis direction and the line of bypass line group 540 that extend in the X-axis direction, such that a scan signal is transmitted thereto.

Although the lines of bypass line group 540 have been described as extending in the X-axis direction along the non-display area 320, exemplary embodiments are not limited thereto. The lines of bypass line group 540 may extend in the X-axis direction in the display area 310, for example, between the scan lines SL.

In addition, according to exemplary embodiments, although the contact holes of contact hole groups 515 and 535 have been described as being located in the non-display area 320, exemplary embodiments are not limited thereto. That is, the contact holes of contact hole groups 515 and 535 may be located in the display area 310 and the bypass lines of bypass line groups 510 and 530 may be disposed in the display area 310.

In addition, an additional scan driver may be disposed on the opposite side of the scan driver 102 and the additional scan driver may supply scan signals to the lines of the third line group 450. In addition, the scan driver 102 may be a single scan driver disposed on the upper side or the lower side of the display panel. A single scan driver may be a driver in which the scan driver 102 and the data driver 103 are integrated. The single scan driver on the upper side or the lower side of the display panel transmits scan signals to the scan lines 431, 432, 433, 434, 435, 436, 437 and 438 or the lines of bypass line groups 460, 465 and 520 through lines extending in the Y-axis direction along the non-display area 320 at a left edge and/or a right edge of the display panel 101 or lines disposed in the Y-axis direction in the display area 310.

In addition, according to exemplary embodiments, when the bypass wirings are disposed in the display area, to maintain uniformity between portions where the bypass wirings are disposed and portions where the bypass wirings are absent, dummy wirings that have a substantially same shape as the bypass wirings may be disposed at portions where the bypass wirings are absent.

Hereinabove, according to exemplary embodiments, bypass wirings of a display panel that include the plurality of sensor areas 311 and 312 have been described with reference to FIGS. 19 and 20. Although bypass wirings have been described with respect to the bypass wirings of the scan lines SL, exemplary embodiments are not limited thereto. The data lines DL, like the scan lines and the bypass lines, may be divided into groups of the same type.

FIGS. 21A, 21B, 21C and 21D are cross-sectional views illustrating a touch panel and a sealing member of a display device according to an exemplary embodiment.

Figure 21A:
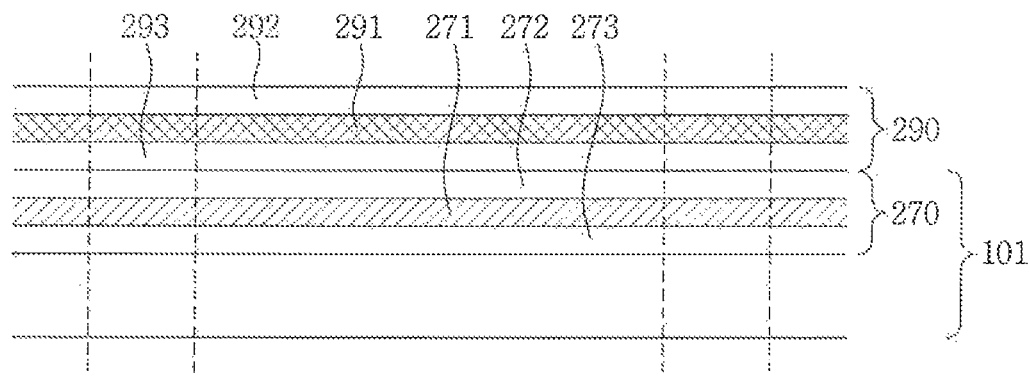
FIGS. 21A, 21B, 21C and 21D are cross-sectional views of a touch panel and a sealing member of a display device according to an exemplary embodiment.

As illustrated in FIGS. 5 and 21A, according to exemplary embodiments, a display device 100 includes a sealing member 270 above a display panel 101. The sealing member 270 is formed into a thin film encapsulation structure in which one or more inorganic layers 271 and one or more organic layers 272, 273 are alternately stacked along a Z-axis direction. In addition, the display device 100 includes a touch panel 290 on the sealing member 270. The touch panel 290 includes a metal touch electrode 291 that senses a touch and an insulating layer, and adhesive layer or protective films 292 and 293 above or below the touch electrode 291.

Figure 21B:
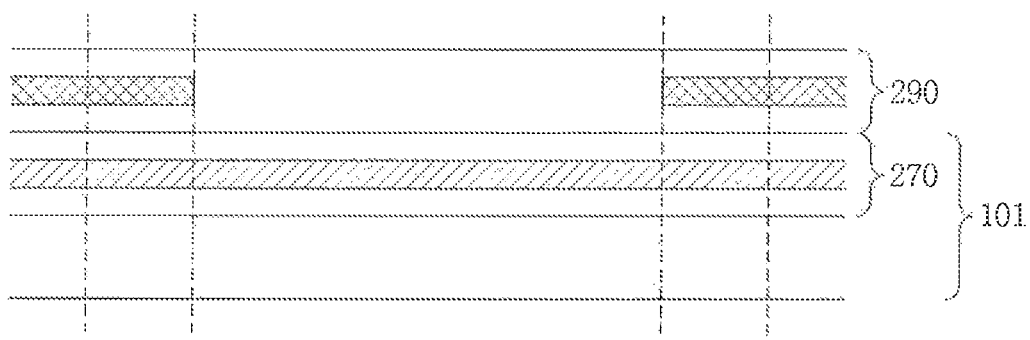

As illustrated in FIG. 21B, according to exemplary embodiments, the touch electrode 291 in the touch panel 290 is disposed in a display area 310 and a wiring connection area 340, and the touch electrode 291 is not disposed in a sensor area 330. That is, the touch electrode 291 is not formed in the sensor area 330 or is removed therefrom.

Figure 21C:
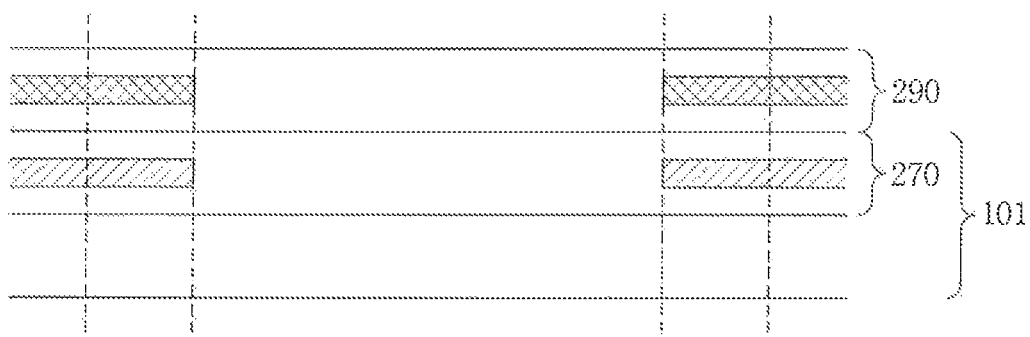

In addition, according to exemplary embodiments, as illustrated in FIG. 21C, the sealing member 270 has a structure in which organic layer 271 and inorganic layers 272 and 271 are alternately disposed in the display area 310 and the wiring connection area 340, and the inorganic layers 272 and 273 are disposed in the sensor area 330, and the organic layer 271 is not disposed in the sensor area 330. That is, the organic layer 271 is not formed in the sensor area 330 or is removed therefrom.

Figure 21D:
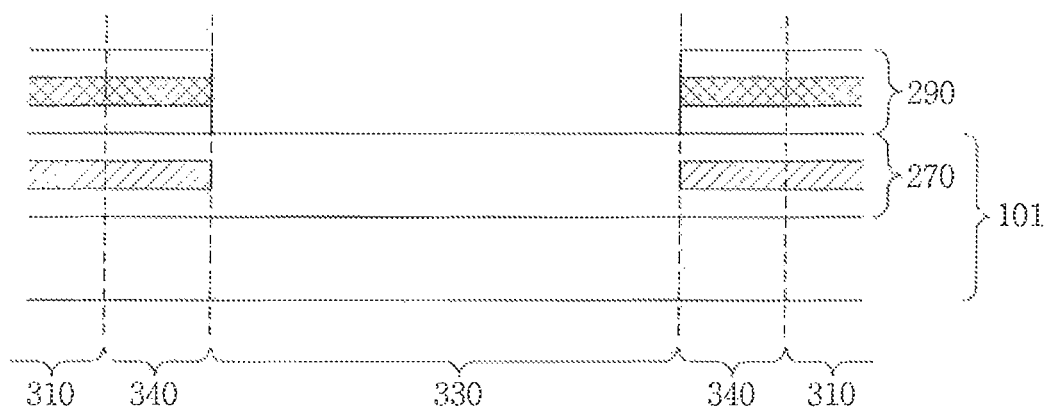

In addition, according to exemplary embodiments, as illustrated in FIG. 21D, the touch panel 290 is disposed in the display area 310 and the wiring connection area 340, but not in the sensor area 330. That is, in addition to the touch electrode 291, the insulating layer and the adhesive layer or protective films 292 and 293 are not formed at the sensor area 330 or are removed therefrom.

In an exemplary embodiment, as shown in FIG. 8, a pixel electrode PE, a light blocking layer 240, a light emitting layer 250, a common electrode 260, etc., are not formed in the sensor area 330 of the display panel 101, or are removed therefrom. In addition, at least one of a buffer layer 120, a gate insulating layer 140, first, second and third insulating interlayers 160, 180 and 200 and a planarization layer 220 are not formed at or are removed from an area in the sensor area 330 of the display panel 101 that does not overlap the above-described lines 151, 153, 211, 212, 191 and 194.

As set forth hereinabove, in a display device according to one or more exemplary embodiments, an area that is occupied by wirings that traverse a sensor area can be substantially minimized in a plan view. Accordingly, signal transmittance of the sensor area may be improved.

In addition, in a display device according to one or more exemplary embodiments, signal transmittance in the sensor area can be improved by reducing the number of insulating layers disposed in the sensor area.

While embodiments of the present disclosure have been illustrated and described with reference to the exemplary embodiments thereof, it will be apparent to those of ordinary skill in the art that various changes in form and detail may be made thereto without departing from the spirit and scope of the present invention.

What is claimed is:

1. A display device comprising:
 a substrate that includes a display area in which a plurality of pixels are disposed, a sensor area in the display area, the sensor area overlapping a sensor, and a wiring connection area between the display area and the sensor area;
 a first wiring and a second wiring disposed in the display area that extend in a first direction and are connected to the plurality of pixels;
 a third wiring disposed in the sensor area and that extends in the first direction, wherein the third wiring is connected to the second wiring and overlaps the first wiring in a plan view, wherein the third wiring is spaced apart from the first wiring with a first insulating layer interposed therebetween; and
 a fourth wiring connected to the pixel and that extends in a second direction that crosses the first, second and third wirings, wherein the fourth wiring is spaced apart from the first, second and third wirings by a second insulating layer.

2. The display device of claim 1, wherein a contact hole penetrates the first insulating layer in the wiring connection area through which the second wiring is connected to the third wiring.

3. The display device of claim 2, wherein the third wiring further comprises a first bent portion in the wiring connection area that extends in a second direction that crosses the first direction, wherein the first bent portion connects to the second wiring through the contact hole.

4. The display device of claim 1, wherein the first wiring extends in the first direction into the sensor area.

5. The display device of claim 1, further comprising a plurality of dummy pixels in the wiring connection area adjacent to the display area.

6. The display device of claim 1, wherein the first wiring and the second wiring are disposed on a substantially same layer.

7. The display device of claim 1, wherein the second wiring and the third wiring are disposed on a substantially same layer.

8. The display device of claim 7, wherein the third wiring further comprises a second bent portion in the wiring connection area that extends in the second direction.

9. The display device of claim 7, wherein the third wiring overlaps the first wiring in the wiring connection area and the sensor area in a plan view.

10. The display device of claim 1, wherein the fourth wiring is disposed above the third wiring.

11. The display device of claim 1, wherein the fourth wiring is disposed below the third wiring.

12. The display device of claim 1, wherein the pixel comprises a pixel electrode on the substrate, a light emitting layer on the pixel electrode and a common electrode on the light emitting layer,
 one of the first wiring, the third wiring or the fourth wiring is disposed in the sensor area in substantially the same layer as the pixel electrode, and
 at least one of the pixel electrode, the light emitting layer or the common electrode is not disposed in the sensor area.

13. The display device of claim 1, wherein one of the first wiring, the third wiring or the fourth wiring is a transparent electrode or a nanowire in a form of a mesh in the sensor area.

14. The display device of claim 1, further comprising at least one floating wiring that overlaps the fourth wiring in a plan view and that is connected to the fourth wiring through a contact hole.

15. The display device of claim 1, further comprising a sealing member on the substrate, the sealing member comprising one or more inorganic layers and one or more organic layers which are alternately disposed,
 wherein the organic layer is disposed outside the sensor area.

16. The display device of claim 1, further comprising a touch electrode on the substrate,
 wherein the touch electrode is disposed outside the sensor area.

17. A display device comprising:
 a substrate that includes a display area in which a plurality of pixels are disposed and a sensor area in the display area, the sensor area overlapping a sensor; and
 a gate wiring, a data wiring and a power wiring connected to the pixel, wherein the pixel comprises an organic light emitting diode,
 wherein the power wiring has a mesh shape in which a plurality of wirings cross each other in a plane and are not disposed in the sensor area, wherein the power wiring provides a driving voltage to the organic light emitting diode of the pixel,
 wherein the power wiring comprises a first power wiring that extends in a first direction and a second power wiring that is connected to the first power wiring via a contact hole positioned in the display area and extends in a second direction that crosses the first direction,
 wherein the first power wiring and the second power wiring are spaced apart from each other by a first insulating layer and are connected to each other through a contact hole formed in the first insulating layer.

18. The display device of claim 17, wherein the first power wiring and the second power wiring are disposed on a substantially same layer.

19. The display device of claim 17, wherein the first power wiring and the gate wiring are disposed in substantially a same layer and the second power wiring and the data wiring are disposed in substantially a same layer.

20. The display device of claim 17, further comprising a sealing member on the substrate, the sealing member comprising one or more inorganic layers and one or more organic layers which are alternately disposed,
wherein the organic layer is disposed outside the sensor area.

21. The display device of claim 17, further comprising a touch electrode on the substrate, wherein the touch electrode is disposed outside the sensor area.

22. A display device comprising:
a substrate that includes a display area in which a plurality of pixels are disposed and a sensor area in the display area, the sensor area overlapping a sensor; and
a gate wiring, a data wiring and a power wiring connected to the pixel, wherein the pixel comprises an organic light emitting diode,
wherein the power wiring has a mesh shape in which a plurality of wirings cross each other in a plane and are not disposed in the sensor area, wherein the power wiring provides a driving voltage to the organic light emitting diode of the pixel,
wherein the power wiring comprises a first power wiring that extends in a first direction and a second power wiring that is connected to the first power wiring via a contact hole positioned in the display area and extends in a second direction that crosses the first direction,
wherein at least one of the gate wiring or the data wiring crosses the sensor area,
wherein the gate wiring comprises a first gate wiring and a second gate wiring, and
the first gate wiring and the second gate wiring are spaced apart from each other in the display area and overlap each other in a plan view in the sensor area with a second insulating layer disposed therebetween.

23. The display device of claim 22, wherein each of the plurality of pixels comprises a pixel electrode connected to the data wiring, a light emitting layer on the pixel electrode and a common electrode on the light emitting layer, and
one of the data wiring, the first gate wiring or the second gate wiring is disposed in the sensor area in substantially a same layer as the pixel electrode.

24. The display device of claim 23, wherein the one of the data wiring, the first gate wiring or the second gate wiring is a transparent electrode or a nanowire in a form of a mesh in the sensor area.

25. A display device comprising:
a substrate that includes a display area in which a plurality of pixels are disposed and a sensor area in the display area, the sensor area overlapping a sensor; and
a gate wiring, a data wiring and a power wiring connected to the pixel, wherein the pixel comprises an organic light emitting diode,
wherein the power wiring has a mesh shape in which a plurality of wirings cross each other in a plane and are not disposed in the sensor area, wherein the power wiring provides a driving voltage to the organic light emitting diode of the pixel,
wherein the power wiring comprises a first power wiring that extends in a first direction and a second power wiring that is connected to the first power wiring via a contact hole positioned in the display area and extends in a second direction that crosses the first direction,
wherein at least one of the gate wiring or the data wiring is not disposed in the sensor area,
wherein at least one of the gate wiring or the data wiring comprises a first wiring, a second wiring disposed in the display area and that extend in a first direction across the sensor area and are separated from each other by the sensor area, and a third wiring disposed outside the sensor area and that connects the first wiring and the second wiring.

26. The display device of claim 25, wherein the third wiring is spaced apart from the first wiring and the second wiring with a third insulating layer interposed therebetween and the third wiring is connected to the first wiring and the second wiring through a contact hole formed in the third insulating layer.

27. A display device comprising:
a substrate that includes a display area in which a plurality of pixels are disposed and a sensor area in the display area, the sensor area overlapping a sensor;
a first wiring connected to the pixel, wherein the first wiring extends in a first direction and crosses the sensor area;
a second wiring connected to the pixel, wherein the second wiring extends in the first direction crosses the sensor area, wherein the second wiring includes a bent portion in the display area that extends in a second direction that crosses the first direction;
an insulating layer between the first wiring and the second wiring,
wherein the insulating layer overlaps an entirety of at least one of the first wiring and second wiring in the sensor area in a plan view and is disposed only within a predetermined distance from the at least one of the first wiring and second wiring in a plan view in the sensor area.

28. The display device of claim 27, comprising a sealing member on the substrate, the sealing member comprising one or more inorganic layers and one or more organic layers which are alternately disposed, wherein the organic layer is disposed outside the sensor area.

* * * * *